US 7,015,489 B2

(12) United States Patent
Singer et al.

(10) Patent No.: US 7,015,489 B2
(45) Date of Patent: Mar. 21, 2006

(54) COLLECTOR HAVING UNUSED REGION FOR ILLUMINATION SYSTEMS USING A WAVELENGTH LESS THAN OR EQUAL TO 193 NM

(75) Inventors: Wolfgang Singer, Aalen (DE); Wilhelm Egle, Aalen (DE); Markus Weiss, Aalen (DE); Joachim Hainz, Aalen (DE); Jochen Wietzorrek, Aalen (DE); Frank Melzer, Utzmemmingen (DE); Johannes Wangler, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/625,254

(22) Filed: Jul. 23, 2003

(65) Prior Publication Data

US 2004/0065817 A1   Apr. 8, 2004

Related U.S. Application Data

(63) Continuation of application No. PCT/EP02/00608, filed on Jan. 23, 2002.

(30) Foreign Application Priority Data

| Jan. 23, 2001 | (DE) | 101 02 934 |
| Jun. 6, 2001 | (DE) | 101 27 298 |
| Aug. 10, 2001 | (DE) | 101 38 313 |

(51) Int. Cl.
*G01G 1/00*   (2006.01)

(52) U.S. Cl. ............ 250/504 R; 250/492.2; 250/494.1

(58) Field of Classification Search ........... 250/492.2, 250/494.1, 504 R
See application file for complete search history.

(56) References Cited

U.S. PATENT DOCUMENTS

| 1,865,441 | A |   | 7/1932 | Mutscheller |
| 5,002,379 | A | * | 3/1991 | Murtha ................ 359/853 |
| 5,192,869 | A | * | 3/1993 | Kumakhov ........... 250/505.1 |
| 5,682,415 | A | * | 10/1997 | O'Hara ................ 378/147 |
| 5,745,547 | A |   | 4/1998 | Xiao .................. 378/145 |
| 5,763,930 | A |   | 6/1998 | Partlo ................. 250/504 |
| 5,768,339 | A |   | 6/1998 | O'Hara ................ 378/147 |
| 6,064,072 | A |   | 5/2000 | Partlo et al. .......... 250/504 |
| 6,198,793 | B1 |  | 3/2001 | Schultz et al. .......... 378/34 |
| 6,244,717 | B1 |  | 6/2001 | Dinger ................ 359/859 |
| 6,285,737 | B1 | * | 9/2001 | Sweatt et al. ........... 378/85 |
| 2004/0130694 | A1 | * | 7/2004 | Kurt et al. ............. 355/69 |

FOREIGN PATENT DOCUMENTS

| DE | 3001059 | 2/1981 |
| DE | 19903807 | 11/1999 |
| EP | 0724150 | 7/1996 |

(Continued)

*Primary Examiner*—John R. Lee
*Assistant Examiner*—James J. Leybourne
(74) *Attorney, Agent, or Firm*—Ohlandt, Greeley, Ruggiero & Perle, L.L.P.

(57) ABSTRACT

There is provided a collector for illumination systems for light having a wavelength $\leq 193$ nm comprising. The collector includes (a) a first mirror shell adjacent to, and positioned inside of, a second mirror shell around a common axis of rotation, in which the first and second mirror shells are rotationally symmetric, and (b) a component in a region between the first and second mirror shells. The collector is for receiving the light from a light source via an object-side aperture and for illuminating an area in an image-side plane, and the region is not used by the light.

21 Claims, 19 Drawing Sheets

FOREIGN PATENT DOCUMENTS

| | | | |
|---|---|---|---|
| EP | 0939341 | * | 9/1999 |
| EP | 0955641 | | 11/1999 |
| WO | WO 99/27542 | | 6/1999 |
| WO | WO 99/57732 | | 11/1999 |
| WO | WO 00/63922 | | 10/2000 |
| WO | WO 01/08162 | | 2/2001 |
| WO | WO 01/09681 | | 2/2001 |

* cited by examiner

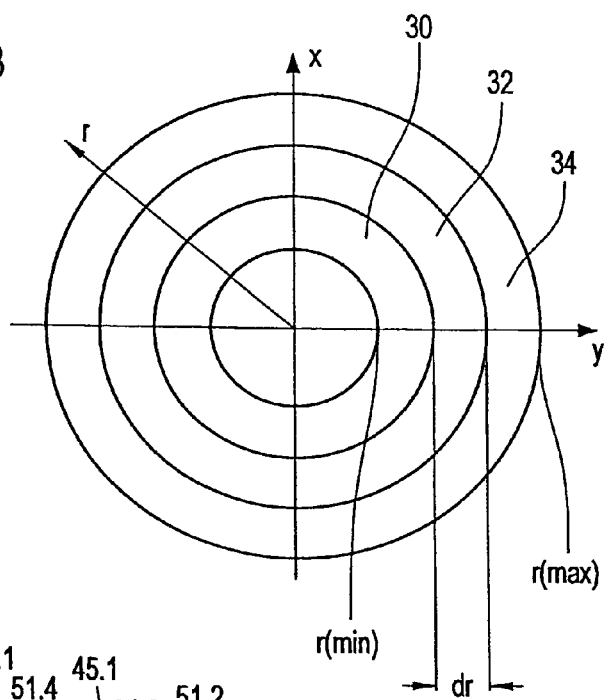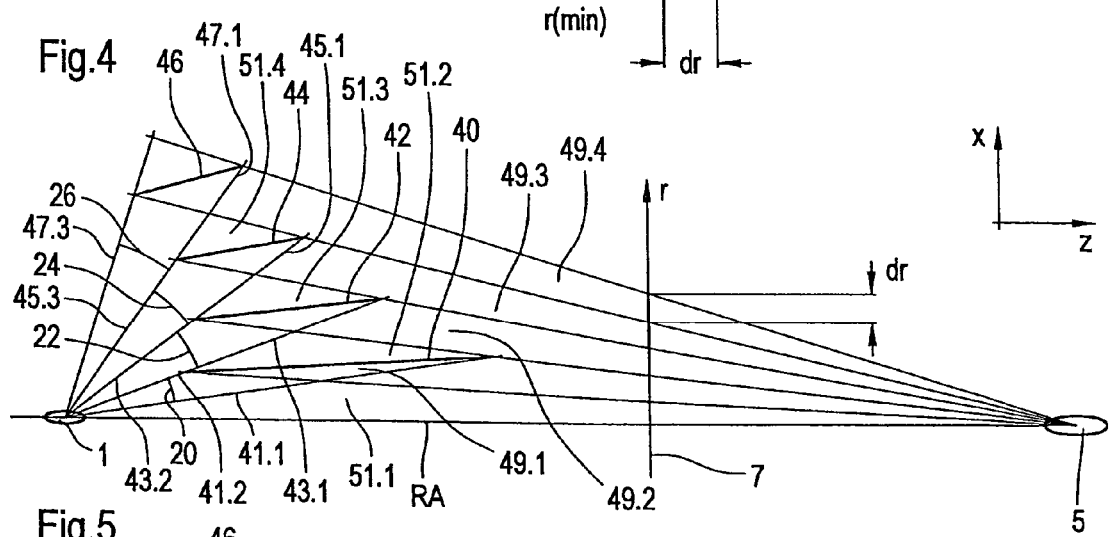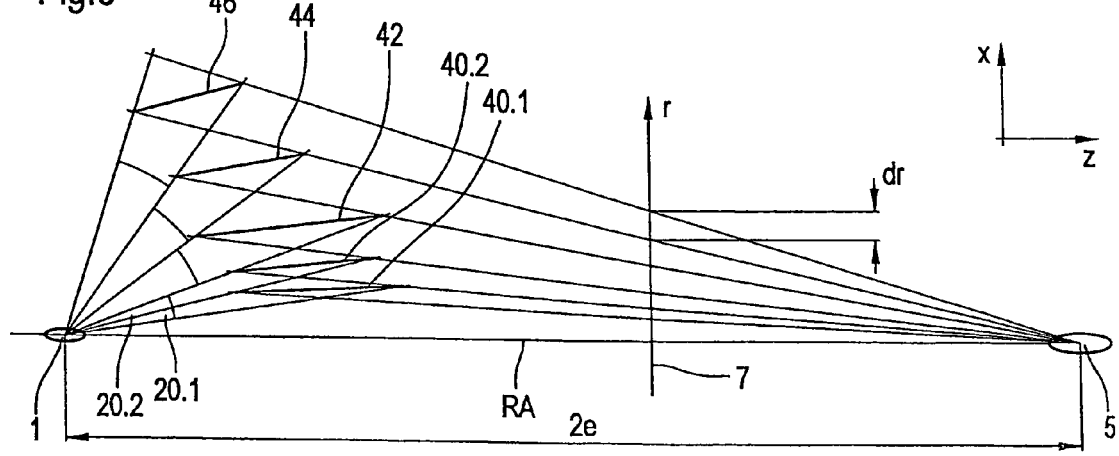

COLLECTOR HAVING UNUSED REGION FOR ILLUMINATION SYSTEMS USING A WAVELENGTH LESS THAN OR EQUAL TO 193 NM

CROSS-REFERENCE TO RELATED APPLICATIONS

The present application is a continuation application of PCT/EP02/00608 which was filed Jan. 23, 2002 and which is incorporated by reference herein. PCT/EP02/00608 claimed priority of (a) German Patent Application 101 02 934 filed Jan. 23, 2001, (b) German Patent Application 101 27 298 filed Jun. 6, 2001 and (c) German Patent Application 101 38 313 filed Aug. 10, 2001,

BACKGROUND OF THE INVENTION

The present invention relates to a collector for illumination systems using a wavelength $\leq 193$ nm, preferably $\leq 126$ nm, particularly preferably wavelengths in the EUV range, for absorbing light emitted by a light source and for illuminating a region in a plane using a plurality of rotationally symmetric mirror shells which are positioned one inside another around a common axis of rotation. One ring aperture element of the object-side aperture is assigned to each mirror shell. The rotationally symmetric mirror shells include at least one first mirror segment having at least one first optical surface. A starting point and an end point are assigned to the first optical surface in relation to the axis of rotation, the starting point defining an outer edge beam and the end point defining an inner edge beam. The inner and outer edge beams limit a light bundle, which is reflected on the first optical surface of the mirror shell and which runs through the collector from the object-side aperture to a region to be illuminated in a plane. The light bundle defines a used region between two adjacent mirror shells.

Furthermore, the present invention also provides an illumination system having such a collector, a projection exposure facility having an illumination system according to the present invention, and a method of exposing microstructures. Nested collectors for wavelengths $\leq 193$ nm, particularly wavelengths in the range of x-rays, are known from many publications.

Thus, for example, U.S. Pat. No. 5,768,339 discloses a collimator for x-rays, the collimator having a plurality of nested paraboloid reflectors. The collimator according to U.S. Pat. No. 5,768,339 is used for the purpose of shaping a beam bundle emitted isotropically from an X-ray light source into a parallel beam bundle.

A nested collector for X-rays is known from U.S. Pat. No. 1,865,441, which, as in the case of U.S. Pat. No. 5,768,339, is used for the purpose of collimating isotropic X-rays emitted from a source into a parallel beam bundle.

U.S. Pat. No. 5,763,930 discloses a nested collector for a pinch plasma light source, which is used for the purpose of collecting the radiation emitted from the light source and bundling it into a light pipe.

U.S. Pat. No. 5,745,547 discloses multiple arrangements of multiple-channel optics, which are used for the purpose of bundling the radiation of a source, particularly X-rays, into a point through multiple reflections.

In order to achieve particularly high transmission efficiency, the invention according to U.S. Pat. No. 5,745,547 suggests elliptical reflectors.

An arrangement for use in X-ray lithography systems, which has nested mirrors positioned parabolically between the X-ray source and the mask, is known from German Patent 30 01 059 C2. These mirrors are positioned in such a way that the diverging X-rays are shaped into an output beam bundle which runs in parallel.

The arrangement according to German Patent 30 01 059 is again used only for the purpose of achieving good collimation for X-ray lithography.

The arrangement of nested reflectors known from WO 99/27542 is used, in an X-ray proximity lithography system, for the purpose of refocusing light of a light source so that a virtual light source is formed. The nested shells may be ellipsoidal.

A nested reflector for high-energy photon sources is known from U.S. Pat. No. 6,064,072, which is used for the purpose of shaping the diverging X-rays into a beam bundle which runs in parallel.

WO 00/63922 discloses a nested collector which is used for the purpose of collimating a neutron beam.

A nested collector for x-rays is known from WO 01/08162, which is characterized by a surface roughness of the inner, reflecting surface of the individual mirror shells of less than 12 Å rms. The collectors disclosed in WO 01/08162 also include systems having multiple reflections, particularly Wolter systems, and is characterized by high resolution, as is required for X-ray lithography, for example.

For illumination optics for EUV lithography, as in German Patent 199 03 807 or WO 99/57732, for example, in addition to the resolution, high requirements are also necessary with regard to uniformity and telecentricity. In systems of this type, the light of a specific light source is collected by a collector.

The object of the present invention is to specify a collector for an illumination system for microlithography using wavelengths $\leq 193$ nm, preferably $\leq 126$ nm, particularly preferably for wavelengths in the EUV range, which meets the high requirements for uniformity and telecentricity necessary for illumination optics and particularly allows the installation of further components, such as decoupling mirrors, detectors, or elements without optical effect, such as shielding devices, cooling devices, detection devices, or attachment devices, where by the homogeneous illumination in an image plane to remain uninfluenced as much as possible.

This object is achieved according to the present invention by a collector having an object-side aperture which receives light emitted by a light source and all other features of claim 1. The collector according to the present invention comprises a plurality of rotationally symmetric mirror shells which are positioned one inside another around a common axis of rotation. One ring aperture element of the object-side aperture is assigned to each mirror shell. The sizes of the mirror shells in the direction of the axis of rotation and the surface parameters and the positions of the mirror shells are selected in such a way that an unused region is formed between two adjacent mirror shells, an outer mirror shell and an inner mirror shell. In the present application, an unused region is understood as the region between two mirror shells, an inner and an outer mirror shell, which is not used by a light bundle passing through the collector from the object side to the image plane. The unused region is typically on the back, i.e., the non-reflecting side, of the inner mirror shell. Inner mirror shell is understood as the mirror shell which has the smaller distance to the axis of rotation of the two mirror shells, the inner and outer mirror shells.

Cooling devices, which are to be used for the purpose of preventing heating of the mirror shells due to the incident radiation, which is partially absorbed, are preferably positioned in the unused region. The heat load on the individual mirrors may be up to 200 K. By arranging the cooling devices in the unused region between two mirror shells, an additional light loss, which may occur due to the introduction of the cooling devices, may be avoided. The illumination in the plane to be illuminated is therefore not impaired by shadows of the cooling devices. In a preferred embodiment of the present invention, the region to be illuminated includes a plane made of ring elements and a ring aperture element is assigned to each ring element and the size of the mirror shells in the direction of the axis of rotation, their surface parameters, and their position are selected in such a way that the irradiances of the individual ring elements in the plane correspond to each other as far as possible.

The inventors have recognized that by the design of a nested collector according to the present invention, largely uniform illumination may be achieved in a region of a plane. It is especially preferable if the mirror shells are annular segments of an ellipsoid, a paraboloid, or a hyperboloid. A completely parallel beam bundle and therefore a light source which lies in the infinite results for a paraboloid. If, for example, one wishes to produce secondary light sources with the aid of a first optical element, positioned in the plane to be illuminated, having first raster elements according to U.S. Pat. No. 6,198,793 B1, the content of whose disclosure is included in its entirety in the present application, then for mirror shells which are implemented as annular segments of a paraboloid, the individual raster elements must have a collecting effect.

The collecting effect may also be transferred to the collector. A collector of this type according to the present invention would include shells which are sections of ellipsoids, so that a convergent beam bundle is provided. By transferring the collecting effect to a collector which includes shells which are sections of ellipsoids, the first raster elements of the first optical element may be planar facets, for example.

Collectors having shells which are sections of hyperboloids lead to a diverging beam bundle and are particularly of interest if the collector is to be dimensioned as small as possible.

In contrast to the nested collectors according to the state of the art, the collector according to the present invention is distinguished in that the sizes of the reflectors of the different shells are different in the direction of the axis of rotation. In this way, largely homogeneous illumination may be provided in an annular region of the plane to be illuminated. If the dimensions and intervals of the reflectors are essentially identical, as in the related art cited in the introduction, a collimated beam and/or a focused beam may be achieved, for example, but homogeneous illumination in an annular region may not. In addition, the reflection losses, which are a function of the angle, may be compensated for through suitable layout of the collector, so that there is homogeneous illumination in the plane.

In a preferred embodiment of the collector according to the present invention, the position of an outer mirror shell is further away from the plane to be illuminated than the position of an inner mirror shell. In this case, the position of a mirror shell is understood as the average of the starting point and end point of a shell in relation to the axis of rotation of the collector. Inner mirror shell is understood as the mirror shell which has the smaller distance to the axis of rotation of the two mirror shells, the inner and outer mirror shells.

Since homogenization is only achieved in a discrete approximation even using the nested collectors, it is advantageous if the collector includes as many shells as possible. The collector according to the present invention preferably has more than four, especially preferably more than seven, and particularly preferably more than ten reflectors in a shell-shaped arrangement.

For an isotopically emitting light source, the collector according to the present invention ensures that identical angular segments are imaged on identical areas. In addition, the reflection losses, which are a function of the angle, may be compensated for through suitable layout of the collector, so that there is homogeneous illumination in the plane to be illuminated.

For homogeneous illumination in the plane to be illuminated, it is especially advantageous if the ring elements adjoin one another continuously. Homogeneous illumination in the plane is achieved even if the ring aperture elements assigned to the ring elements do not adjoin one another continuously, but have gaps. Further components, such as devices without optical effect, particularly cooling devices, may especially preferably be positioned in these gaps without light loss occurring in the plane to be illuminated.

If there is a non-isotropic source, the emission characteristic may be converted into homogeneous illumination by the collector.

In a preferred embodiment, the radial sizes of at least two ring elements are equally large and the size in the direction of the axis of rotation of the mirror shell of the collector assigned to the inner ring element is larger than the size in the direction of the axis of rotation of the mirror shell of the collector assigned to the outer ring element. Inner ring element is understood as the ring element which has the smaller distance to the axis of rotation of the two ring elements, the inner and outer ring elements.

The collector according to the present invention is advantageously designed in such a way that the quotient of a first ratio of the radial size of a first ring element to the angular size of the assigned ring aperture element and a second ratio of the radial size of a second ring aperture element to the angular size of the assigned ring aperture element is equal to the quotient of a first radiant intensity, which flows in the first ring aperture element, and a second radiant intensity, which flows in the second ring aperture element, i.e., the following equation is true:

$$\frac{dA_1}{d\Omega_1} \div \frac{dA_2}{d\Omega_2} = I(\alpha_1) \div I(\alpha_2)$$

In an alternative embodiment of the present invention, the nested mirror shells are implemented in such a way that multiple reflections occur on one mirror shell.

Through multiple reflections on one shell, the reflection angle may be kept small.

For reflection with grazing incidence having small angles of incidence of less than 20° relative to the surface tangents for materials such as molybdenum, niobium, ruthenium, rhodium, palladium, or gold, the reflectivity is nearly linear to the angle of incidence relative to the surface tangent, so that reflection losses for a reflection at 16°, for example, or two reflections at 8° are approximately the same. However, for the maximum achievable aperture of the collector, it is advantageous to use more than one reflection.

Systems having two reflections are especially preferred. Collectors having two reflections may, for example, be implemented as nested Wolter systems having first mirror shells which are annular sections of hyperboloids and second mirror shells which are annular sections of ellipsoids.

Wolter systems are known from the literature, from Wolter, Annalen der Physik [Annals of Physics] 10, 94–114, 1952, for example. In regard to Wolter systems having a real focal distance, i.e., a real intermediate image of the source, which is formed by the combination of a hyperboloid surface with an ellipsoid surface, reference is made to J. Optics, Vol. 15, 270–280, 1984.

A special advantage of Wolter systems is that in a Wolter systems having two reflections with angles of incidence less than 20° relative to the surface tangents, a maximum collection aperture of up to $NA_{max}$ 0.95, corresponding to an aperture angle of 80°, may be selected, while still being located in the highly reflective region of the reflection having a reflectivity >70%, with grazing incidence.

In a first embodiment of the present invention, the first annular segment and the second annular segment of a shell do not adjoin one another continuously, but rather an unused region of the mirror shell, a gap, lies between the first and second annular segments.

Further components, particularly elements without optical effect, particularly cooling devices, are preferably positioned in the unused region of the mirror shell of a two-shell system.

Even if these further components are positioned in the unused region between two segments, additional light losses may be avoided.

It is preferable if the individual shells of a nested collector are connected to one another by support devices. Support devices of this type may, for example, include radially running support spokes. Supply and removal devices for supplying coolant to and removing coolant from the cooling devices may be provided in the region of the radially running support spokes. The cooling devices then preferably include cooling channels. Especially good heat dissipation is achieved if the cooling devices are positioned as annular cooling plates in the unused region between two collector shells. The annular plate may include cooling lines. The cooling lines may be guided outward in the shadows of the ribs of the support devices. In a preferred embodiment, the plates may be physically connected to the mirror shells through galvanic deposition, for example. The heat is then removed via thermal conduction. As an alternative to this, the cooling plates may also only be laid on the mirror shells. This is particularly advantageous if deformation would occur between the cooling devices and the mirror shell due to thermal expansion. The heat is then removed not via thermal conduction, but rather via radiation. The annular cooling plates have the advantage of cooling over a large area, which is therefore effective. Furthermore, rotationally symmetric homogeneous cooling is achieved through an arrangement of this type. The optical quality is influenced only very slightly by a cooling arrangement of this type.

In addition to the collector, the present invention also provides an illumination system having a collector of this type. The illumination system is preferably a double-faceted illumination system having a first optical element having first raster elements and a second optical element having second raster elements, as disclosed a U.S. Pat. No. 6,198,793, the content of whose disclosure is included in its entirety in the present application.

The first and/or second raster elements may be flat facets or facets with a collecting or scattering effect.

In one embodiment of the present invention, only one annular region is illuminated on the first optical element having first raster elements. The first raster elements are then preferably positioned inside the annular region.

The illumination system which includes the collector according to the present invention is preferably used in a projection exposure system for microlithography, a projection exposure system of this type being disclosed in PCT/EP/00/07258, the content of whose disclosure is included in its entirety in the present application. Projection exposure systems include a projection objective positioned downstream from the illumination device, for example, a 4-mirror projection objective as disclosed in U.S. Pat. No. 6,244,717, the content of whose disclosure is included in its entirety in the present application.

The present invention will be described in the following for exemplary purposes on the basis of the drawing.

FIG. 3 shows a sketch of the ring elements in the plane

FIG. 4 shows a nested collector made of ellipsoid segments

FIG. 5 shows a nested collector made of ellipsoid segments having a different number of shells than in FIG. 4.

Figure 9:
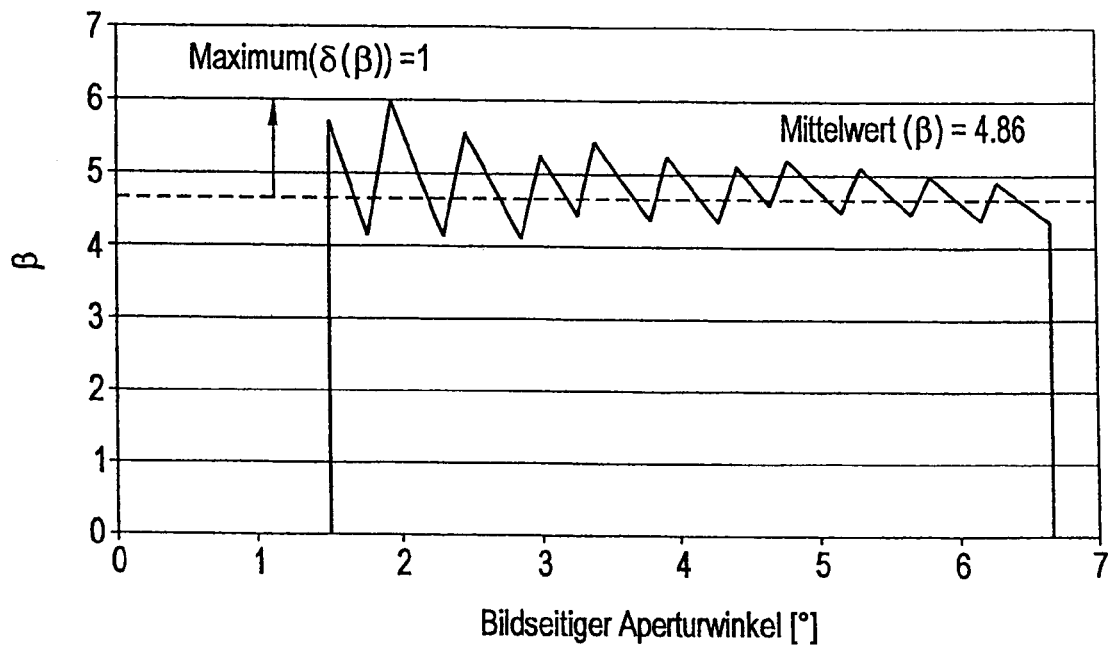
Figure 10:
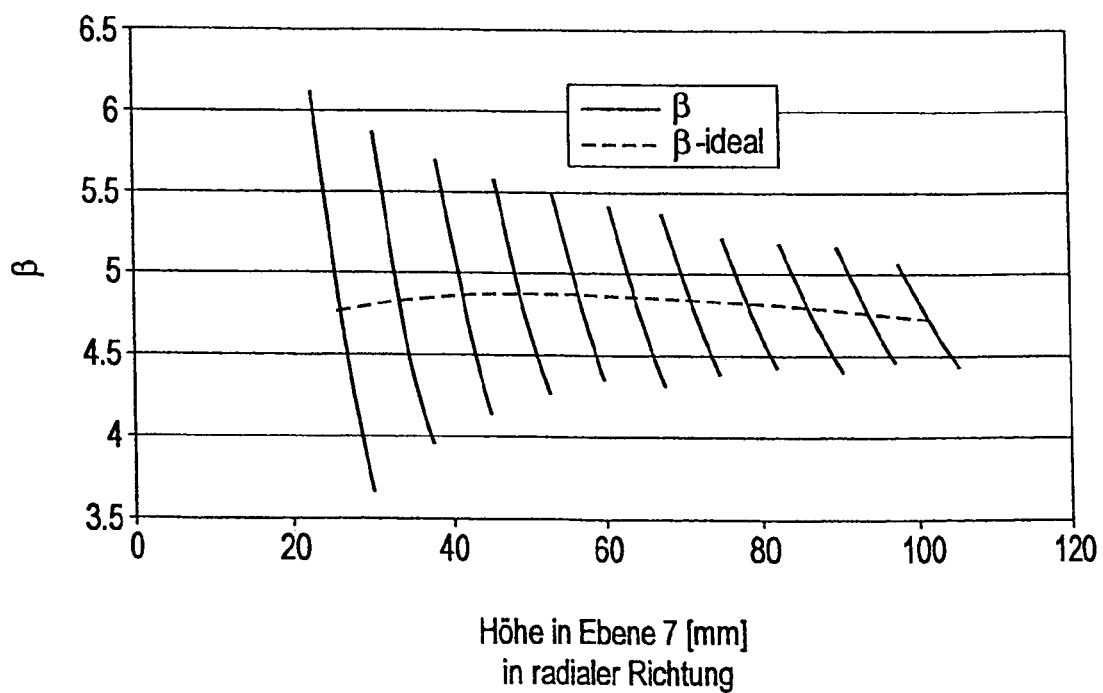
Figure 11:
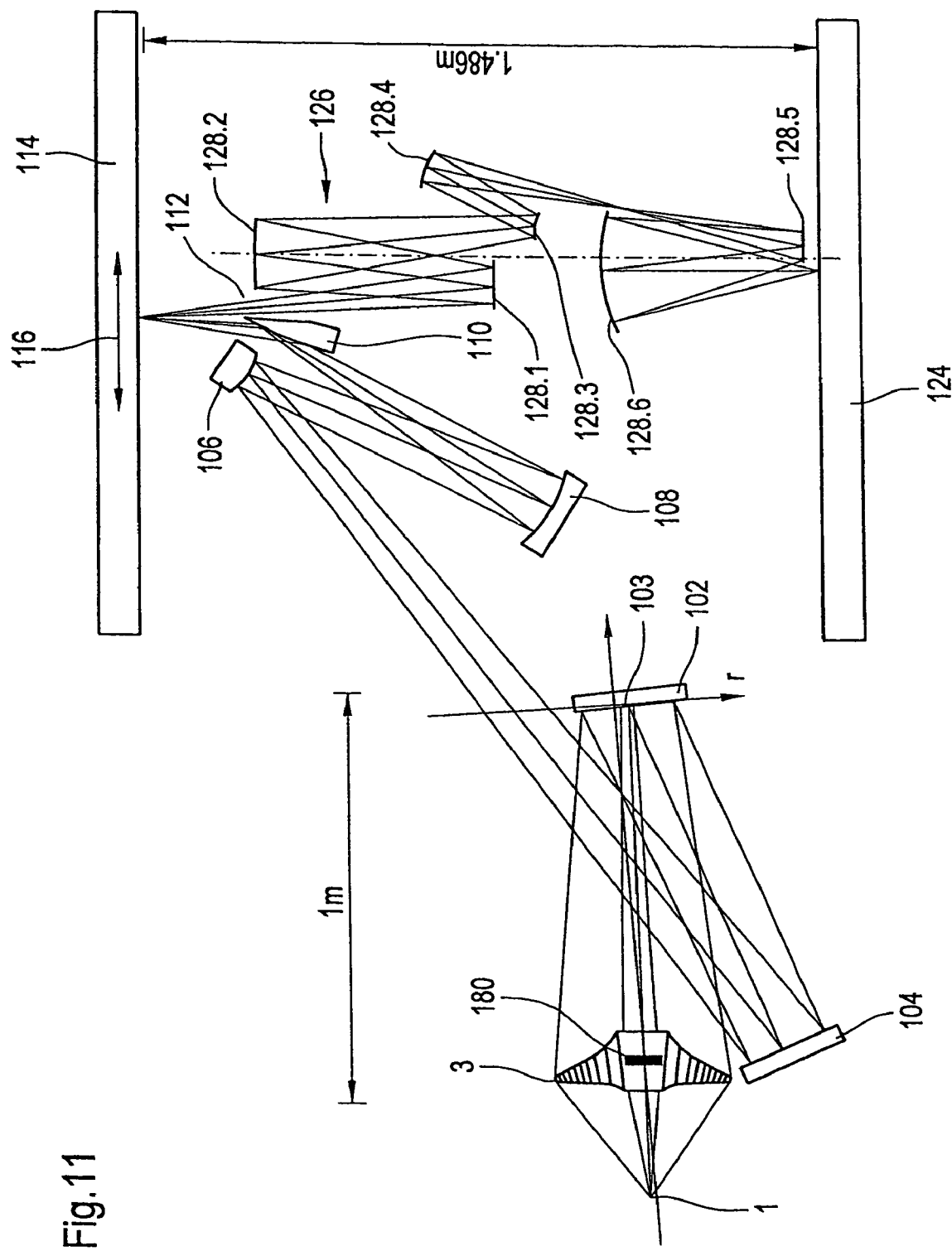
Figure 12:
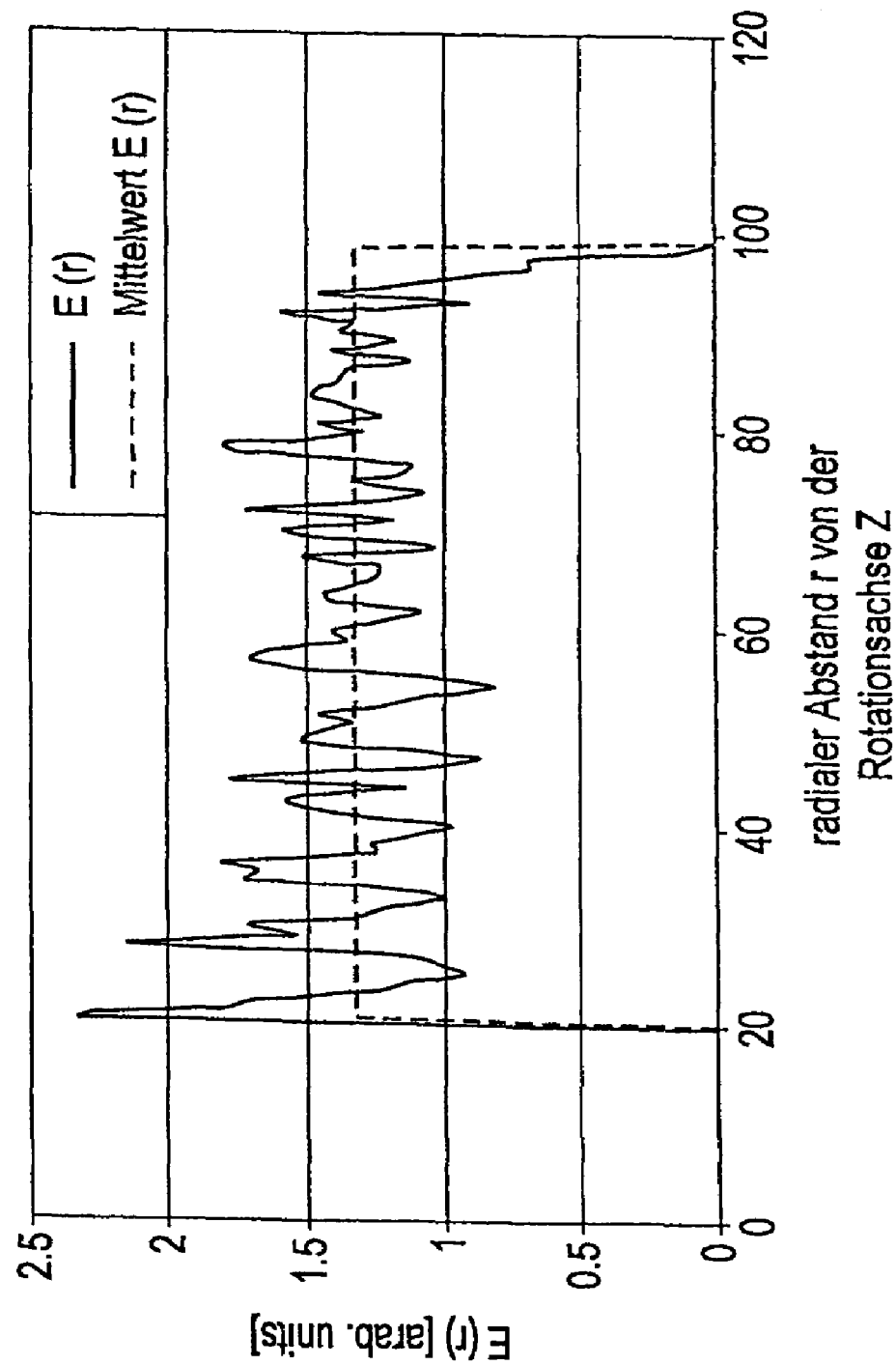
Figure 13:
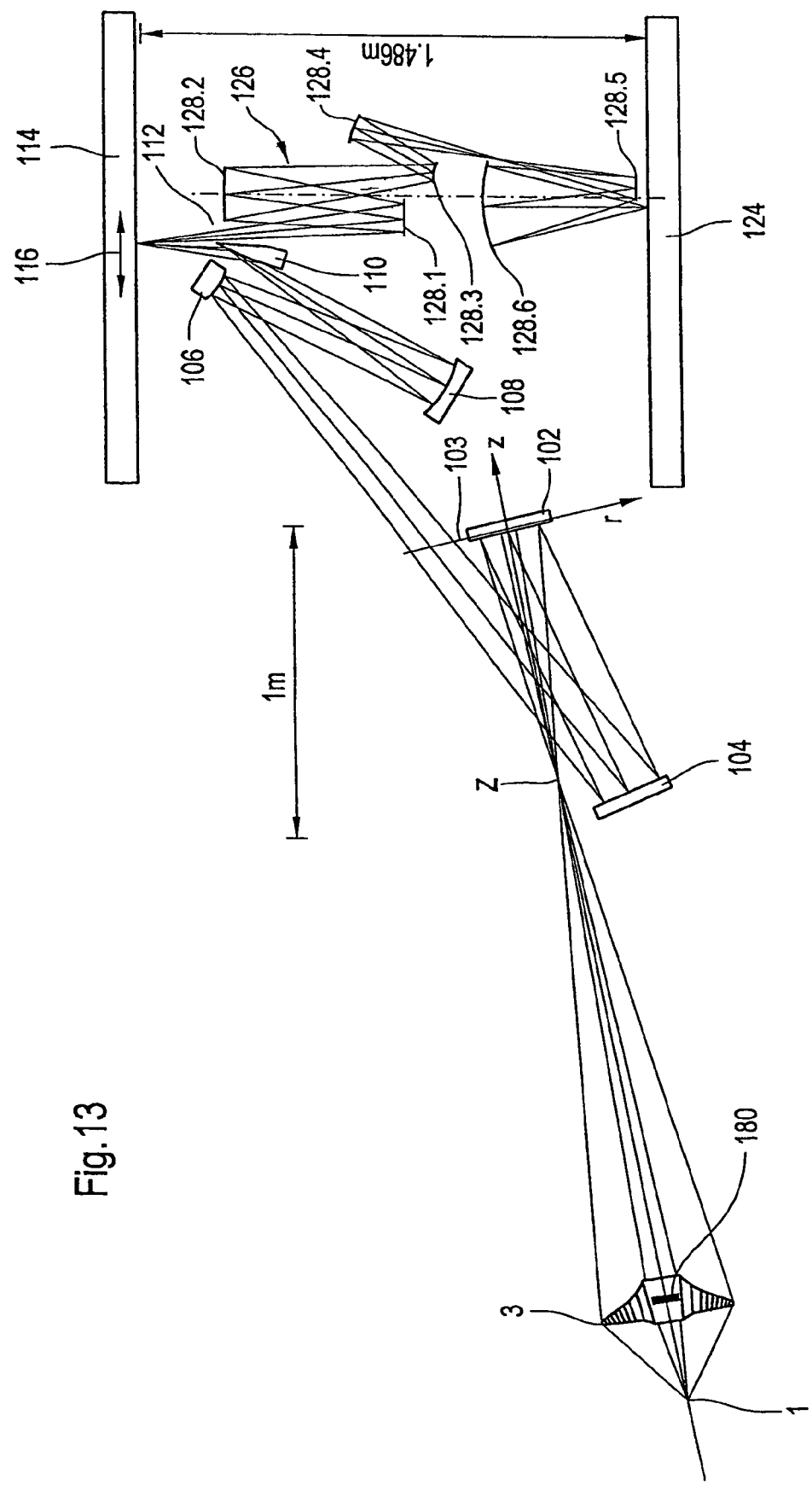
Figure 14:
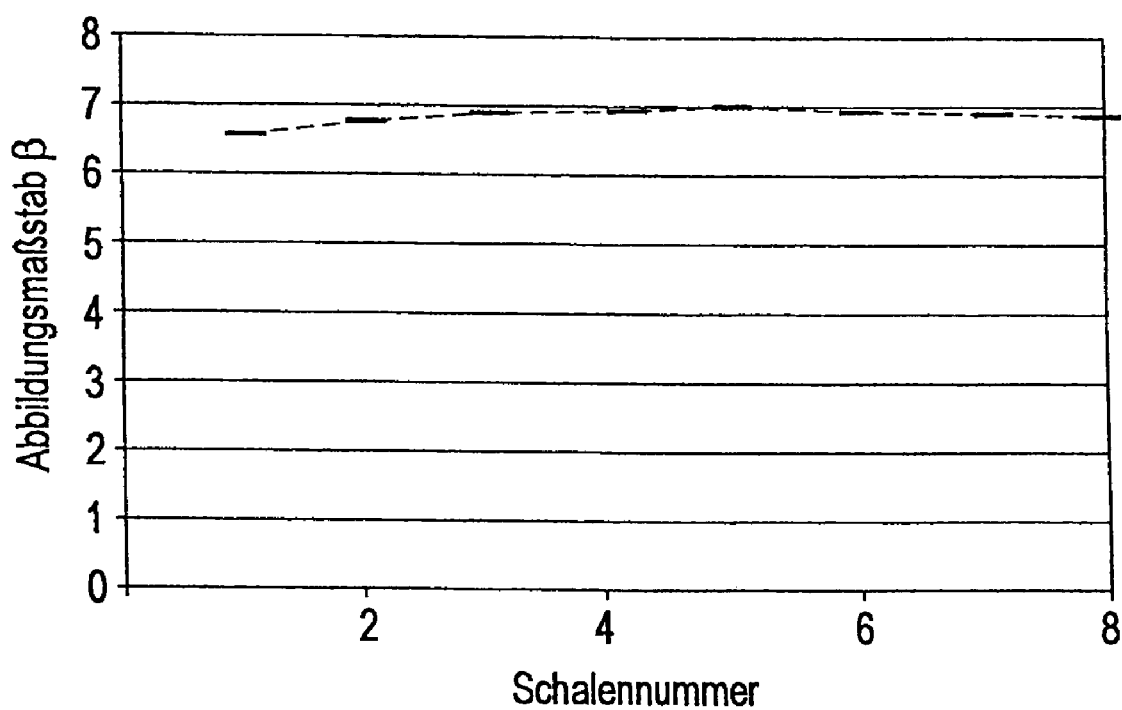
Figure 17:
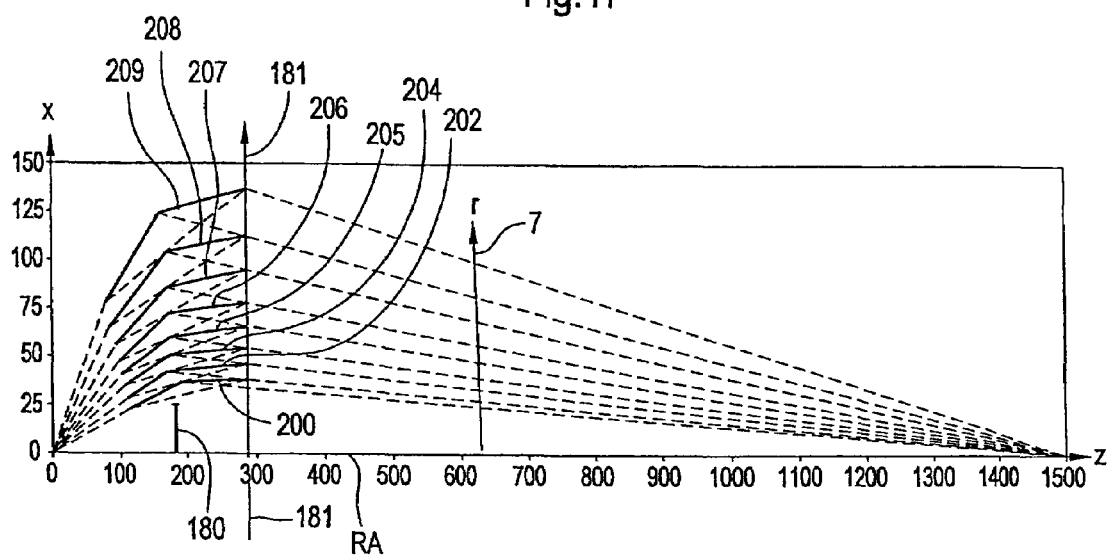

FIG. 9 shows the imaging scale β of the exemplary embodiment shown in Table 1 as a function of the image aperture angle FIG. 10 shows the imaging scale β of the exemplary embodiment shown in Table 1 as a function of the radius r in the plane 7 in the x direction FIG. 11 shows a projection exposure facility having a nested collector according to the present invention FIG. 12 shows the illumination distribution (irradiance) of the ring elements in the plane of the first raster elements of the projection exposure system shown in FIG. 11 as a function of the radial distance to the axis of rotation z of the system FIG. 13 shows a projection exposure system having an intermediate image having a nested collector FIG. 14 shows the imaging scale β of an 8-shell nested Wolter system according to FIG. 17

Figure 15:
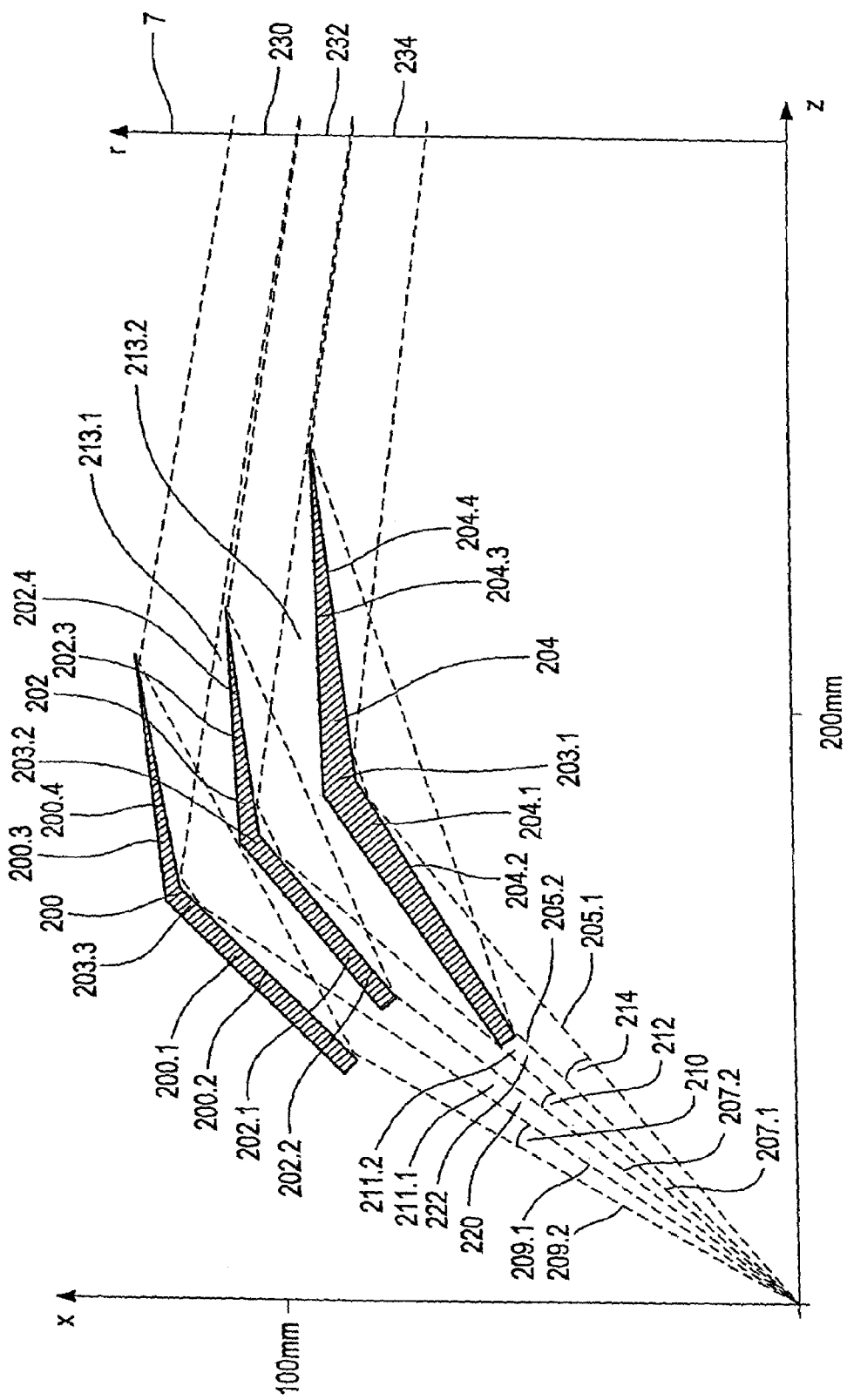
Figure 16:
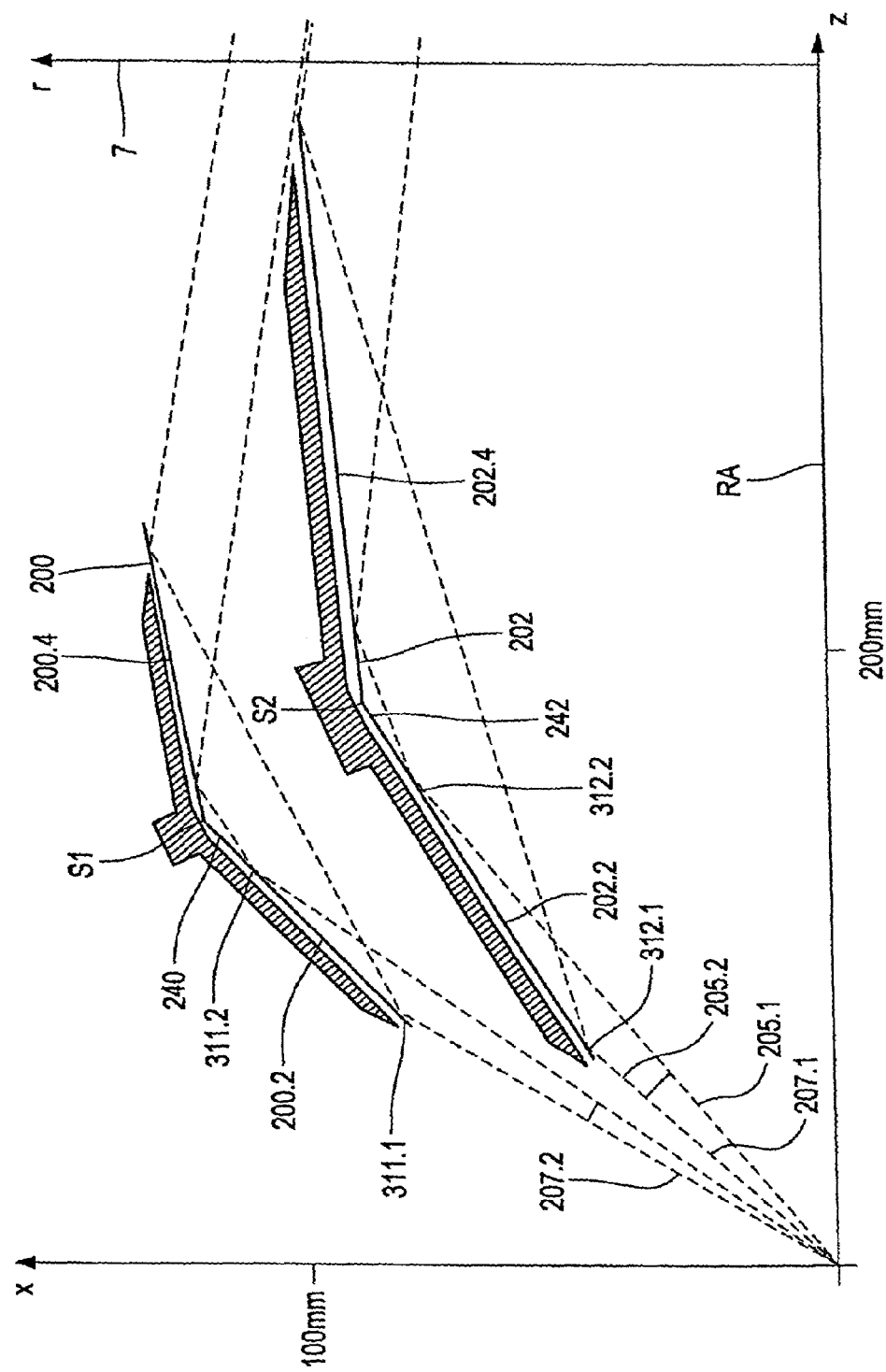
Figure 18:
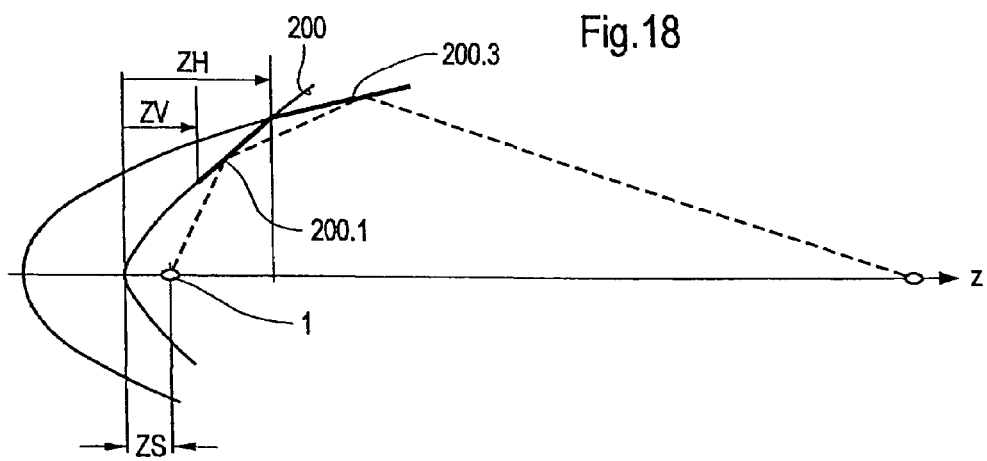
Figure 19:
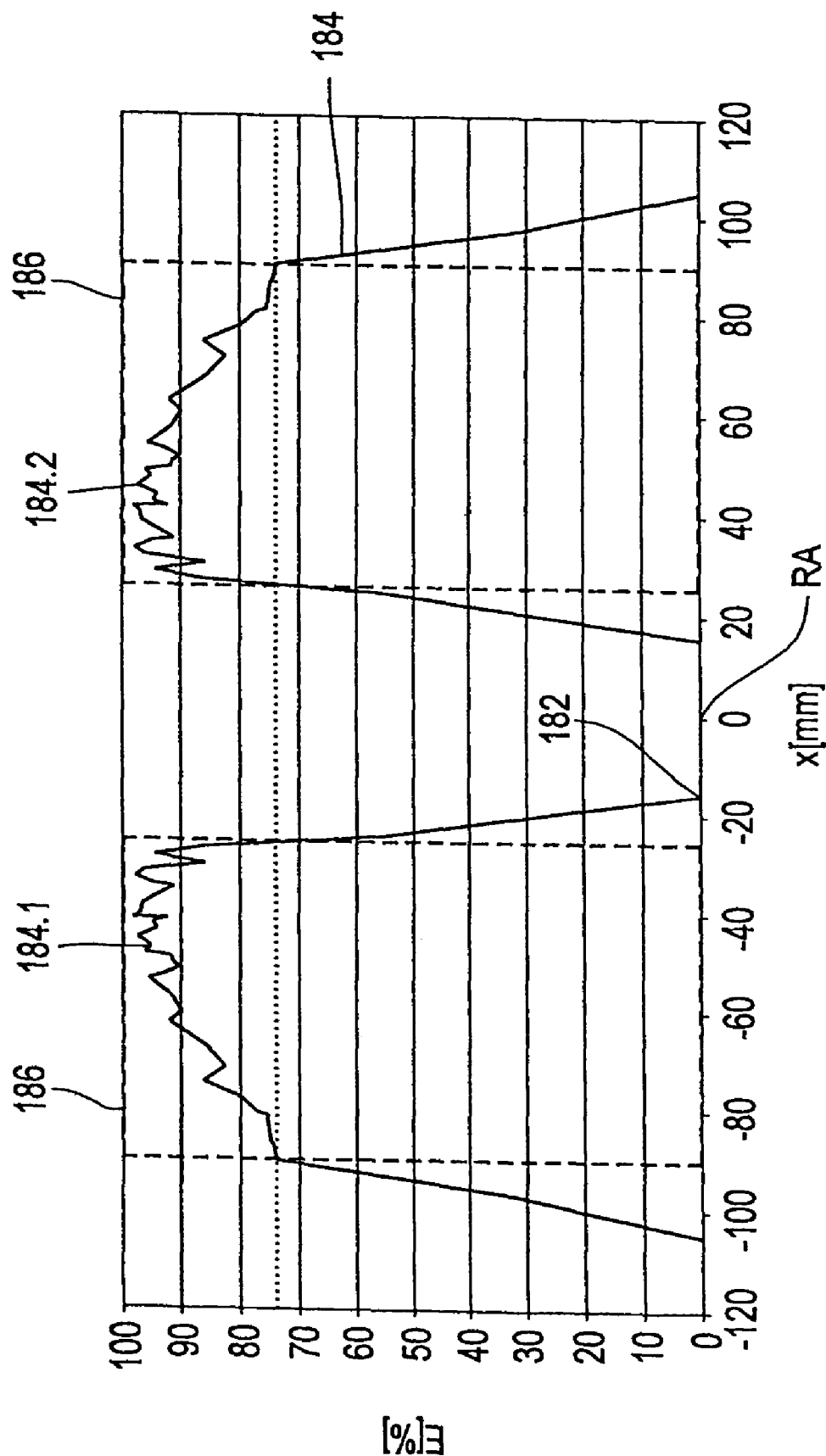
Figure 20:
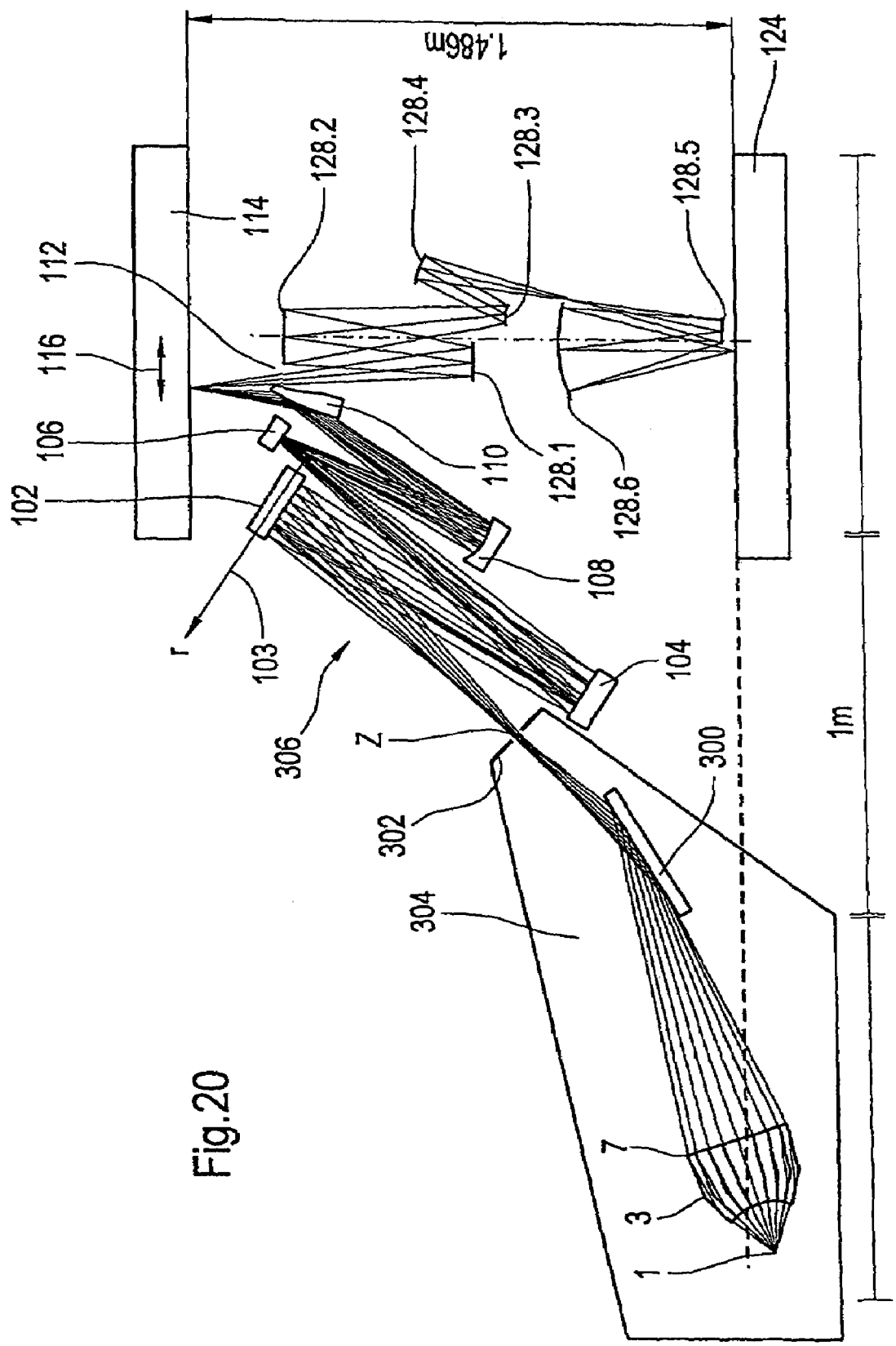

FIG. 15 shows a partial illustration of three shells from a nested Wolter system FIG. 16 shows a partial illustration of two shells from a nested Wolter system FIG. 17 shows an 8-shell nested Wolter system FIG. 18 shows a sketch to explain the coordinates of a collector shell, implemented as a Wolter system having two reflections FIG. 19 shows the illumination distribution (irradiance) of the ring elements in the plane of the first raster elements of a system as shown in FIG. 20 having a collector as shown in FIG. 17

FIG. 20 shows an EUV projection exposure system having a nested collector as shown in FIG. 17

Figure 21:
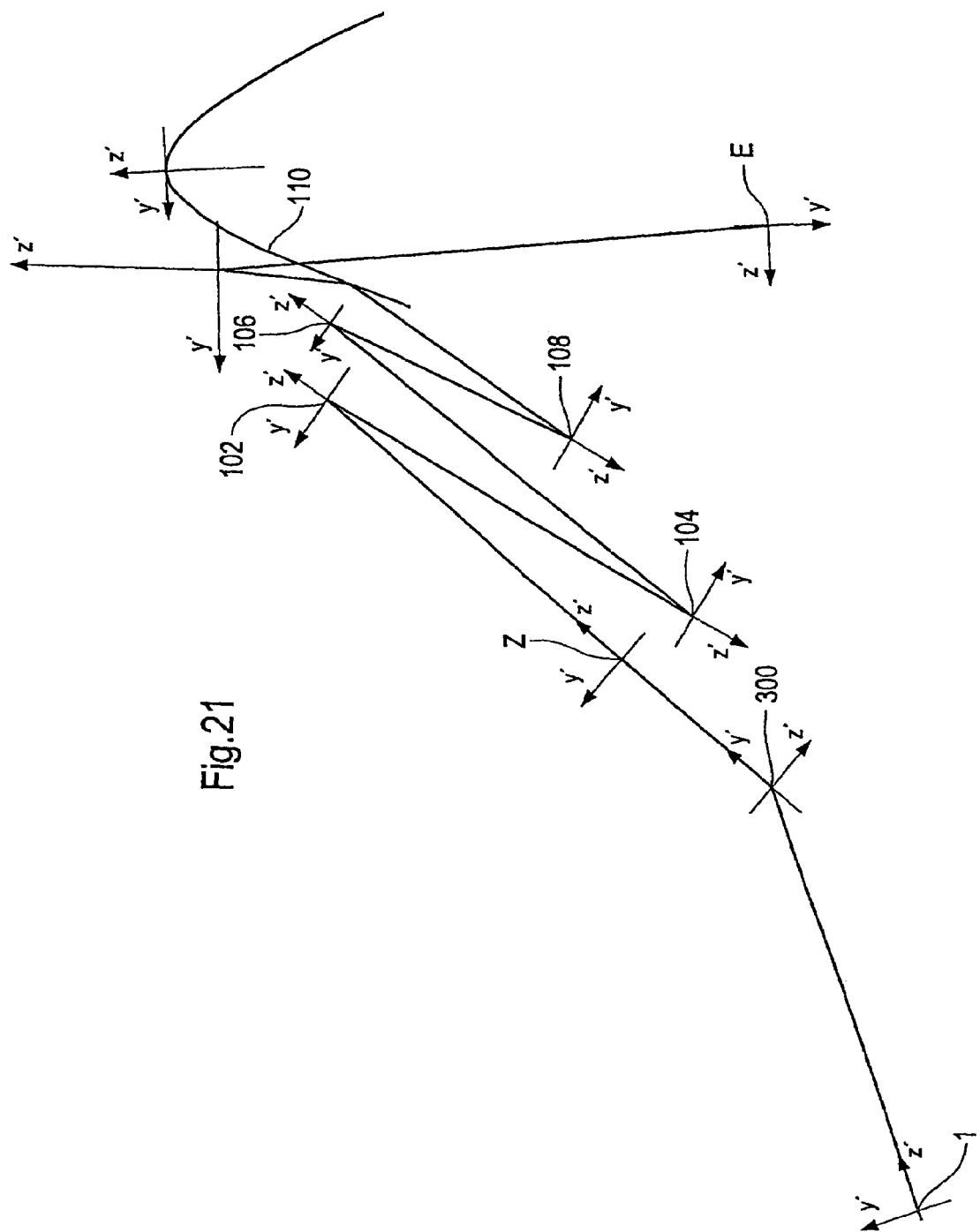

FIG. 21 shows coordinate systems of all mirrors of the EUV projection exposure system shown in FIG. 20 having the nested collector shown in FIG. 17

Figure 22:
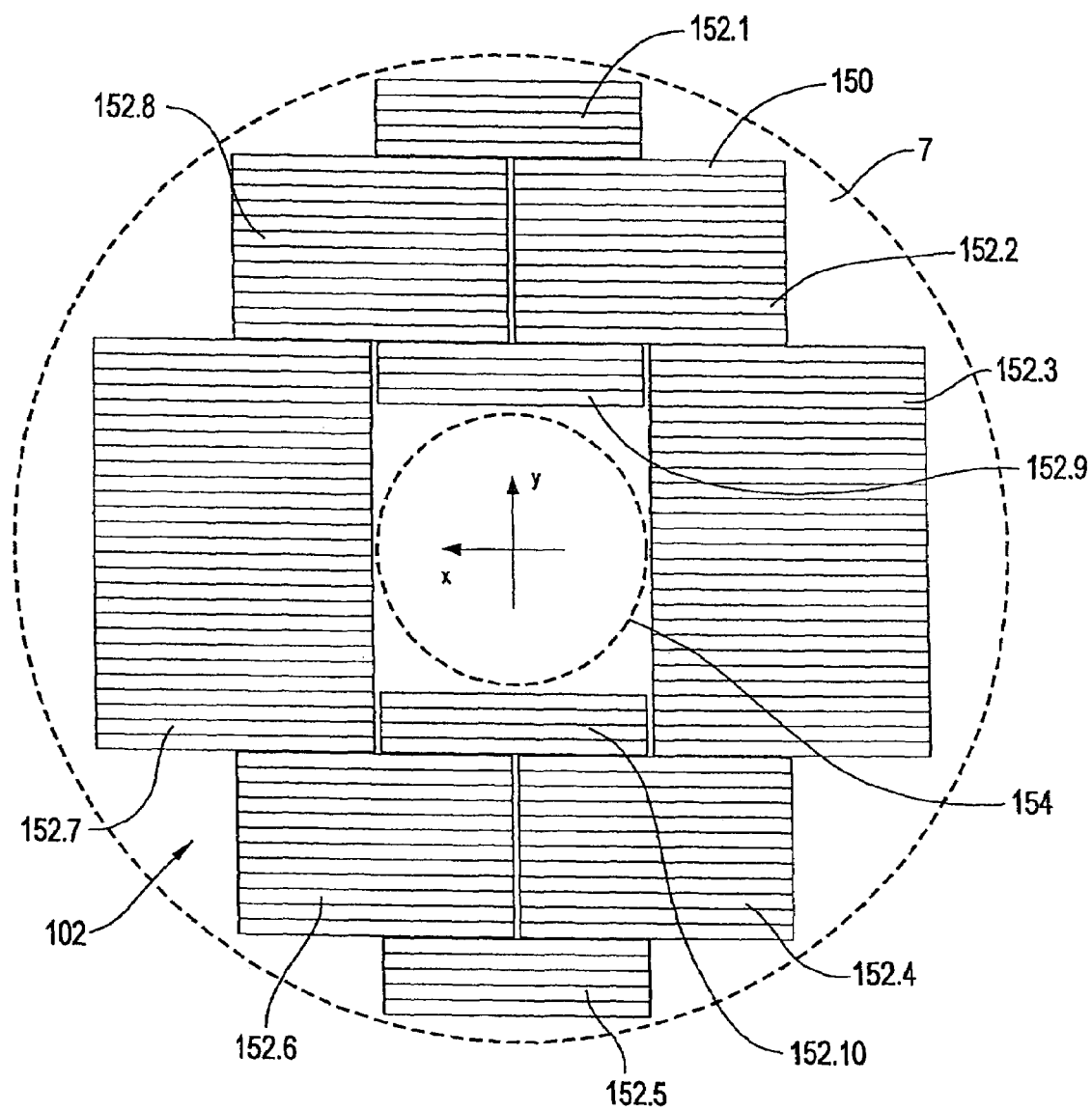
Figure 23:
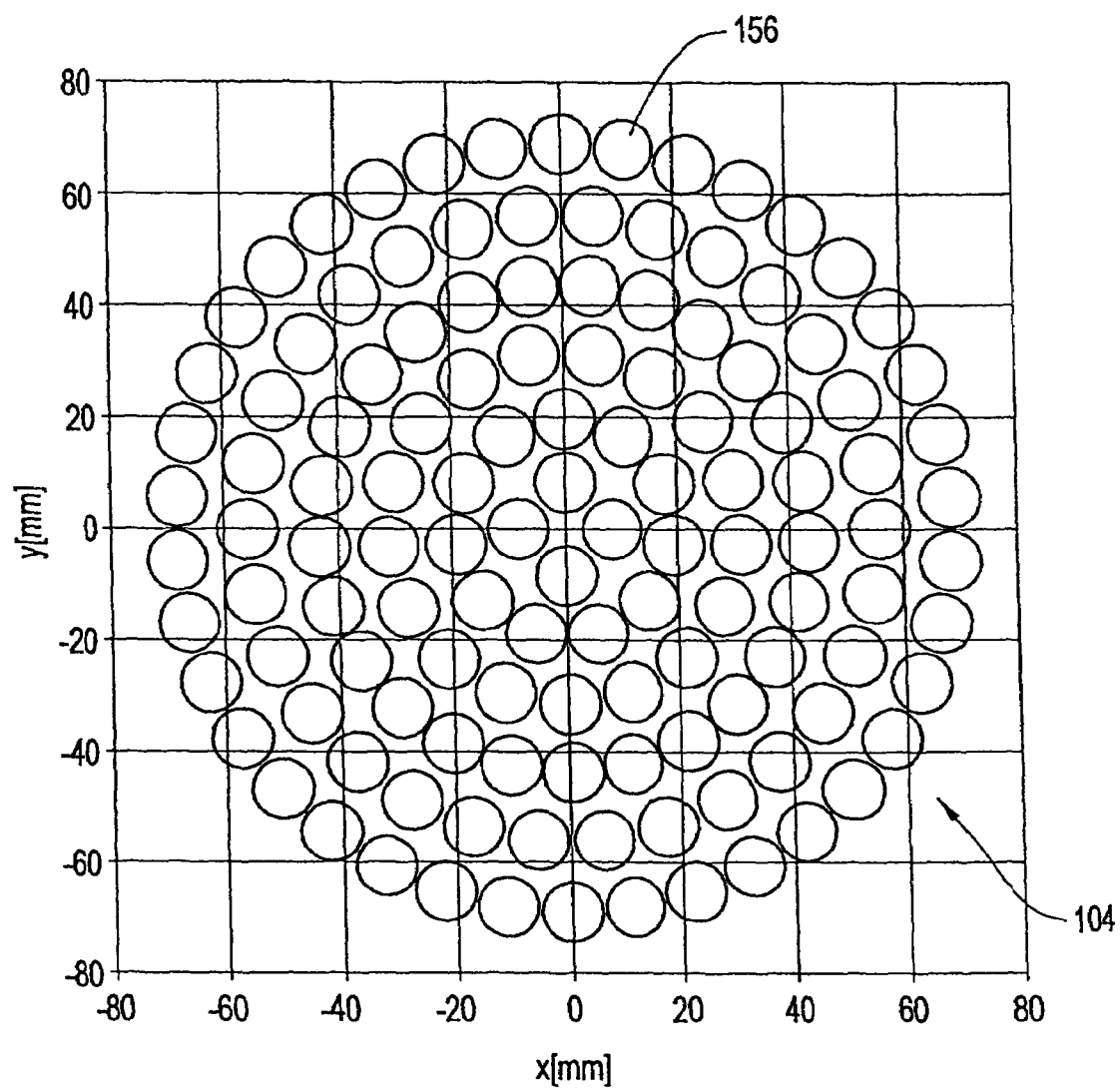
Figure 24:
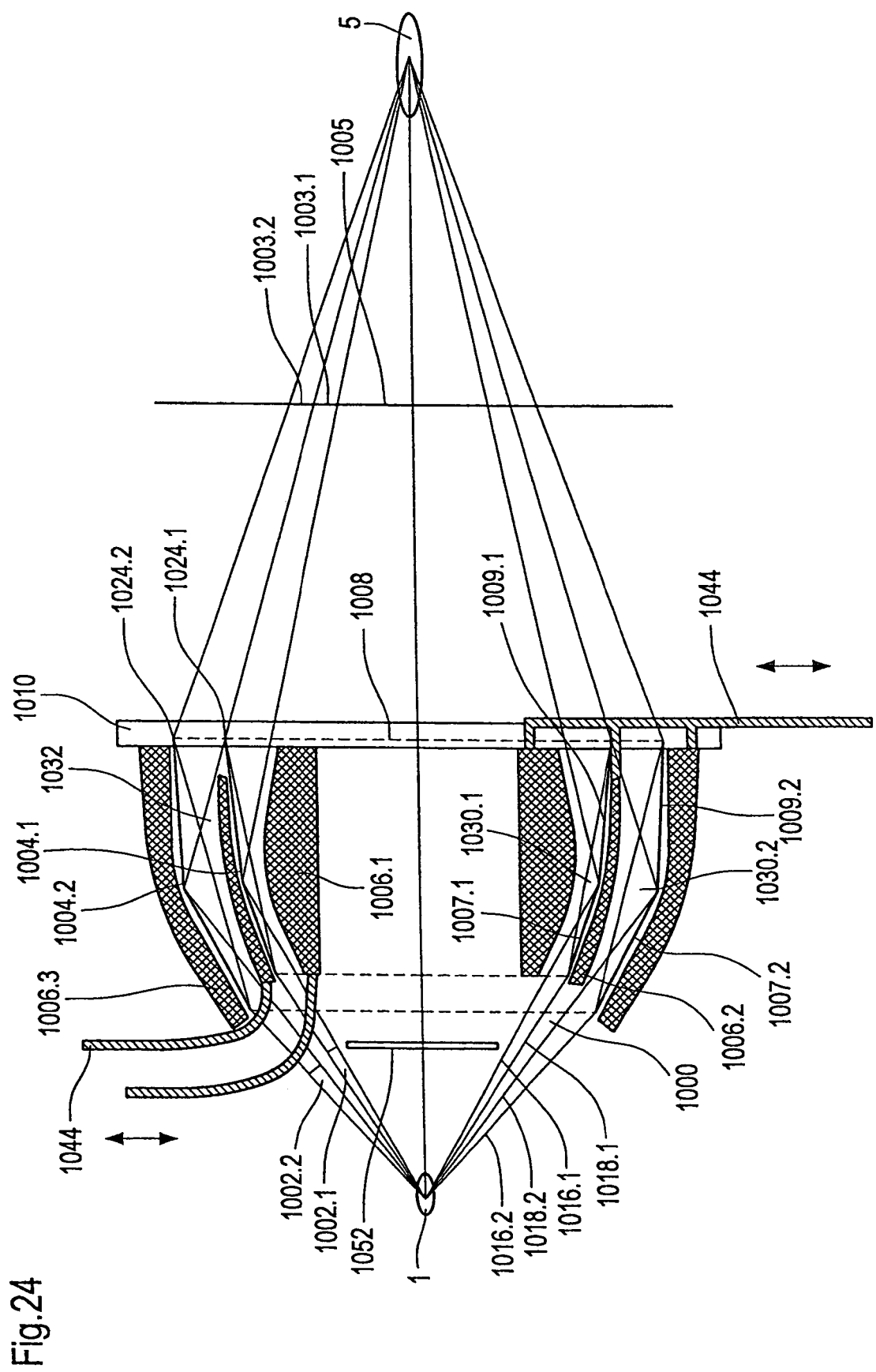
Figure 25:
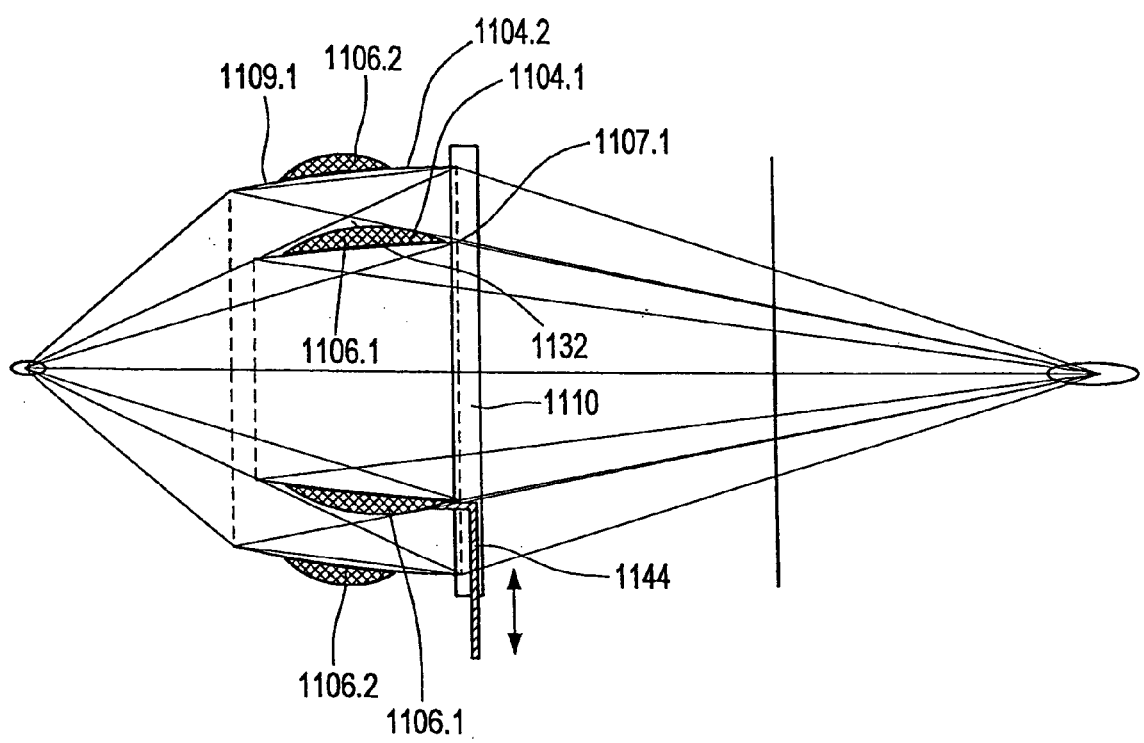
Figure 26:
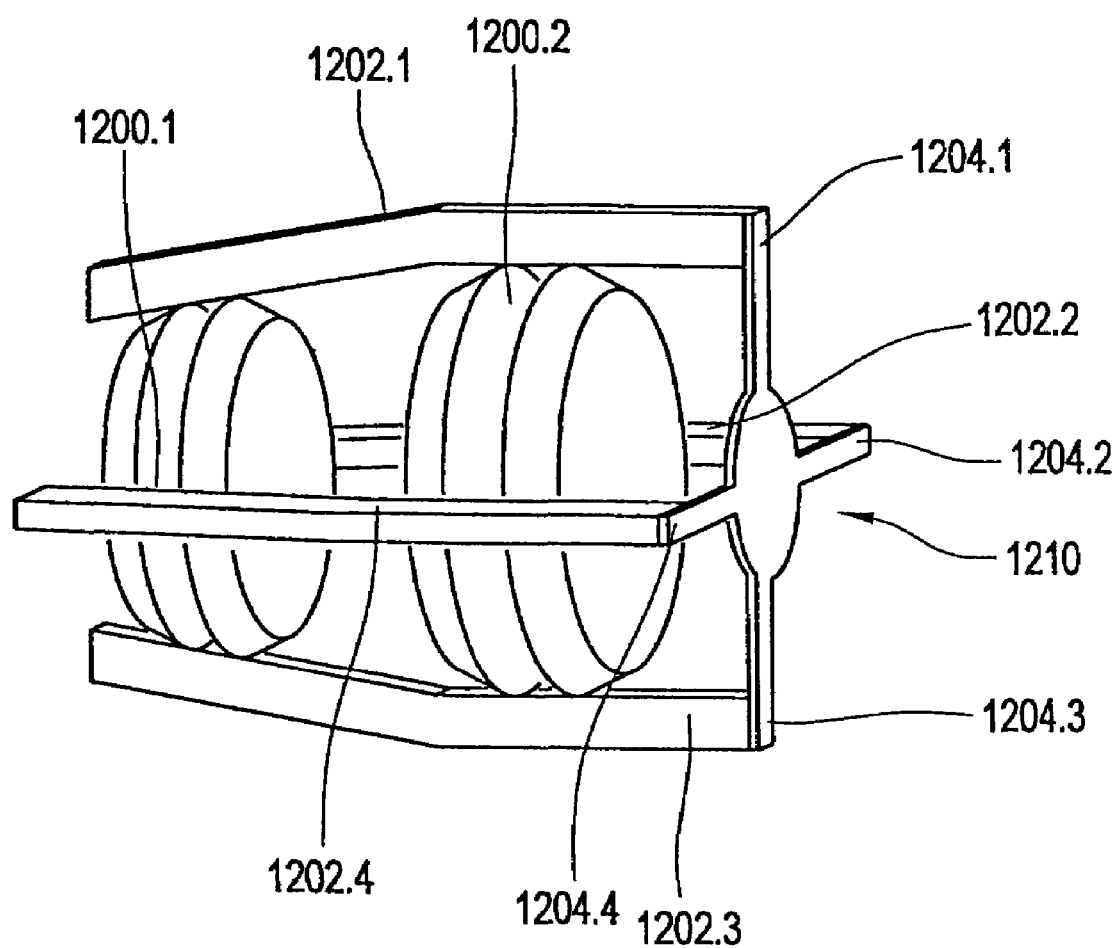

FIG. 22 shows a first optical element of an illumination system as shown in FIG. 20 having first raster elements FIG. 23 shows a second optical element of an illumination system as shown in FIG. 20 having second raster elements FIG. 24 shows a 2-shell nested Wolter system having cooling devices FIG. 25 shows a 2-shell nested ellipsoid collector having cooling devices FIG. 26 shows cooling rings having a support structure.

In the present application, the photometric terms listed in the following table, according to Naumann/Schröder, "Bauelemente der Optik [Components of Optics]", Hauser-Verlag, 1992, pp. 28–29, are used.

TABLE 1

| | Photometric terms | |
|---|---|---|
| Physical dimension | Formula | Unit |
| Radiant flux $\phi_e$ | $\phi_E = \dfrac{\partial Q}{\partial t}$ | Watt [W] |
| Irradiance or flux density $E_e$ | $E_e = \dfrac{d\phi_e}{dA_o}$ | Watt/cm$^2$ |
| Radiant intensity $I_e$ | $I_e = \dfrac{d\phi_e}{d\Omega}$ | Watt/steradian |
| Radiance $L_e$ | $L_e = \dfrac{d\phi_e}{dA_s \cdot \cos\alpha\, d\Omega}$ | Watt/cm$^2$/steradian |

Figure 1:
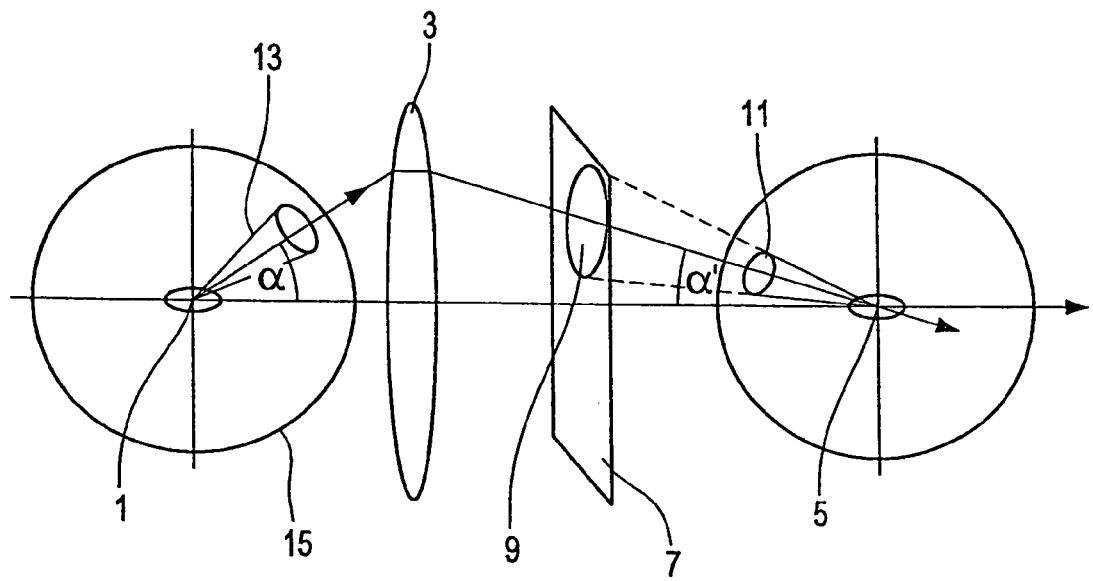
FIG. 1 shows a schematic sketch of a collector

A schematic sketch of a system having light source 1, collector 3, source image 5, and intermediate plane 7 is shown in FIG. 1. The light source 1 emits into the space with a specific radiant intensity. This is generally a function of angles $\alpha$ and $\phi$ (angles around the z-axis, not shown): $I(\alpha\phi)$.

The following equation applies for axially symmetric light sources: $I(\alpha\phi)=I(\alpha)$.

The collector 3 collects the emitted light and bundles it. It images the light source 1, into the light source image 5. Light source image 5 can be either real—as shown in FIG. 1—or virtual. The light source 1 may also already be an image of a physical light source. In both cases, a specific illumination 9 is obtained in a plane 7 behind the collector 3, which corresponds to the projection of the radiant intensity of the cone of radiation 11, i.e., the spatial angular element in the angle $\alpha'$ in the image space of the collector.

If the illumination is homogenized in a plane 7, it is also automatically homogenized in any other plane behind the collector, if it is at a sufficient distance from the image plane in which the image 5 of the light source 1 lies. An associated cone of radiation 13 in the object space, which is filled with the emitted source radiant intensity $I(\alpha)$ in the spatial angular element in the angle $\alpha$, corresponds to the cone of radiation 11 in the image space.

According to the present invention, any arbitrary light source 1 is imaged in an image of the source. The source image may be real (i.e., to the right of the collector 3 in the light direction) or virtual (i.e., to the left of the collector 3 in the light direction), or may lie in the infinite.

In a preferred embodiment of the present invention, the emission characteristic of any arbitrary light source 1 is transformed in such a way that a largely homogeneous illumination results in a plane in front of or behind the intermediate image.

According to the present invention, the following equation is to apply:

$$E = \frac{\phi}{dA} = \frac{R(\alpha) I*(\alpha) d\Omega}{dA} = const. \tag{2.1}$$

E: irradiance in the plane 7
$\phi$: radiant flux
dA: surface element in plane 7
d$\Omega$: angular element in the object-side aperture
$I*(\alpha)$: radiant intensity of the source at the angle
$R(\alpha)$: attenuation factor proportional to light losses through the finite reflectivity of the collector, which is a function of the angle (in the following, $I(\alpha)=R(\alpha)\times I*(\alpha)$ is used without restricting generality)

Therefore, the following equation must apply for two ring elements having equal irradiance:

$$E = \frac{\phi_1}{dA_1} = \frac{I(\alpha_1) d\Omega_1}{dA_1} = \frac{\phi_2}{dA_2} = \frac{I(\alpha_2) d\Omega_2}{dA_2} \tag{2.2}$$

from which the following equation results:

$$\frac{d\Omega_2}{dA_2} \div \frac{d\Omega_1}{dA_1} = I(\alpha_1) \div I(\alpha_2) \tag{2.3}$$

For anisotropic sources or strong differences in-the reflection losses $R(\alpha)$, the ring aperture segments and/or ring elements in plane 7 must be selected in accordance with equation (2.3).

In general, the object of producing an intermediate image and simultaneously adjusting an emission characteristic may not be fulfilled using simple optical elements such as a mirror or a lens. For rotationally symmetric emission characteristics around the z-axis, which is identical to the optical axis of the system in the present case, uniform illumination may be achieved via a special type of Fresnel optic, at least for discrete regions.

This is explained in the following using the example of a real intermediate image of the source 1. For virtual intermediate images or source images in the infinite, similar constructions result in an obvious way for one skilled in the art.

Figure 2:
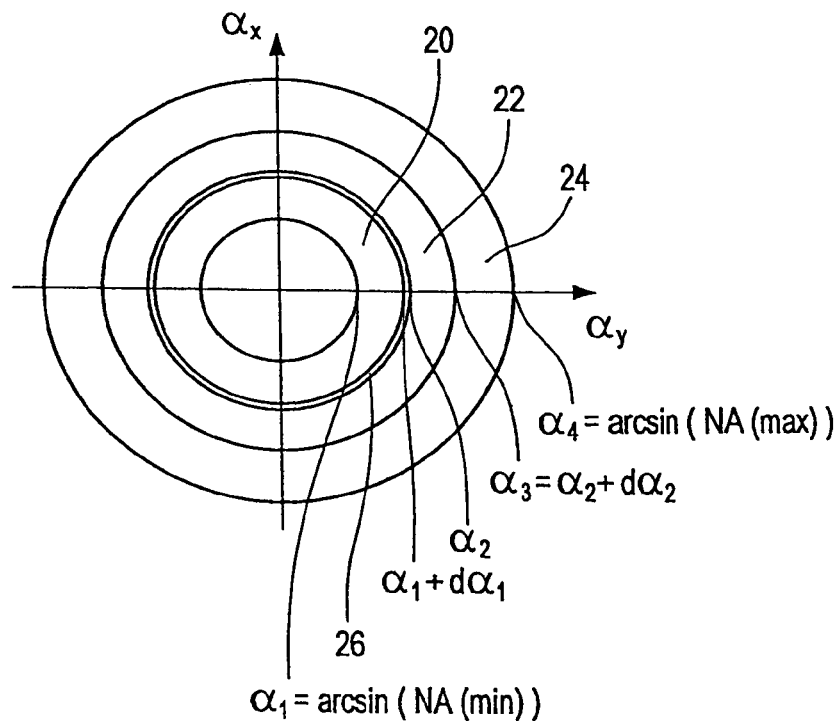
FIG. 2 shows a sketch of the ring aperture element around a light source

Three angular segments and/or ring aperture elements 20, 22, 24, for example, as shown in FIG. 2, are selected around the source 1. The radiant flux through the ring aperture elements is given by:

$$\Phi_i = \int_{\varphi=0}^{2\pi} \int_{\alpha=\alpha_i}^{\alpha_{i+1}} I*(\alpha, \varphi) d\Omega \tag{2.4a}$$

For most of the existing rotationally symmetric sources, whose radiant intensity varies only slightly with the angle $\alpha$, such as the dense plasma focus source, the radiant flux may be approximately described by:

$$\Phi_i \approx 2\pi I*(\alpha_i) \cdot (\cos\alpha_i - \cos\alpha_{i+1}) \tag{2.4b}$$

in which $\phi_i$: radiant flux $I^*(\alpha_i)$: radiant intensity of the source in the angle $\alpha_i$ $\alpha_i$: inner angle of the ith angular segment, $\alpha_{i+1}$: outer angle of the ith segment with $\alpha_{i+1}=\alpha_i+d\alpha_i$ $d\alpha_i$: width of the ith angular segment.

The generally differing angular increments $d\alpha_i$ are determined via equation (2.4), so that the irradiance in the assigned ring elements in plane 7 is largely identical.

The ring aperture segments 20, 22, 24 are shown in FIG. 2. An example having three segments 20, 22, 24 which lie between $NA_{min}$ and $NA_{max}$ is shown. The segments 22 and 24 adjoin one another. A small gap 26 exists between the segments 20 and 22.

The individual ring aperture segments and/or ring aperture elements 20, 22, 24 are assigned to ring elements 30, 32, 34 in the plane 7 to be illuminated, whereby the following equation generally applies:

$$r_{i+1}=r_i+dr_i \quad (2.5)$$

In which $r_i$: inner interval of the ith ring element in the plane 7 to be illuminated $r_{i+1}$: outer interval of the ith ring element in the plane 7 to be illuminated $dr_i$: height increment or radial size of the ith ring element The ring elements 30, 32, 34 are selected, for example, in such a way that equally large intervals $dr_i=dr=$constant are achieved between the edge beams of the ring elements. The illumination in the plane 7 using ring elements 30, 32, 34 is shown in FIG. 3.

For a ring element having largely uniform irradiance in plane 7, the following equation applies for the radiant flux:

$$\Phi_i' = 2\pi \int_{r=r_i}^{r_{i+1}} Erdr \approx \pi E \cdot (r_{i+1}^2 - r_i^2) \quad (2.6)$$

in which $\phi'_i$: radiant flux through the ith ring element in the plane 7 to be illuminated Taking the reflection losses on the ith collector shell $R'(\alpha)$ into consideration, the width $d\alpha_i$ of the ith ring aperture elements and the radial size $dr_i$ of the ith ring segment may thus be determined. For example, the radial size dr selected may be constant. With $$\phi'_i=R'(\alpha_i)\phi_i \quad (2.7)$$

and the requirement for largely uniform irradiance E $$E = \frac{\Phi_i'}{\pi \cdot (r_{i+1}^2 - r_i^2)} = const. \quad (2.8)$$

the following equation results after using equation (2.4) and solving for $\alpha_{i+1}$:

$$\alpha_{i+1} = \arccos\left[\cos\alpha_i - E\frac{(r_{i+1}^2 - r_i^2)}{2I(\alpha_i)\cdot R'(\alpha_i)}\right] \quad (2.9)$$

in which

E: largely uniform irradiance in the plane 7 to be illuminated $r_i$: inner interval of the ith ring element in the plane 7 to be illuminated $r_{i+1}$: outer interval of the ith ring element in the plane 7 to be illuminated $\alpha_i$: inner angle of the ith ring aperture element, $\alpha_{i+1}$: outer angle of the ith ring aperture element.

If the ring elements in plane 7 are selected via equation (2.5), the angle of the ring aperture elements may be determined according to equation (2.9). The edge beams of the ring elements and/or of the ring aperture elements are thus located.

Via the points of intersection of selected beams, the particular elliptical shells of the collector 3 are then located. For a virtual intermediate image, these are hyperboloid, for a source image in the infinite, they are paraboloid. A representative beam is selected in each ring aperture element 20, 22, 24 for this purpose.

For an ellipsoid and/or hyperboloid or paraboloid shell, it is sufficient to specify object point and image point, source 1 and source 5 in this case, and only one further point. In the present case, however, two points, specifically a starting point and an end point of the collector shell, are given, i.e., the problem is overdefined. Since, however, the imaging quality for the source imaging may typically be largely ignored for illumination purposes, the ellipses and/or hyperbolas or parabolas may, for example, have a conical component in the shape of a wedge or truncated cone added, which corresponds to a slight defocusing, which does not come into consideration. Alternatively, slight shadowing is accepted, since the gaps occurring may be selected to be very small. The size of the gaps may be minimized via the layout and particularly the number of shells. The gaps are selected, for example, in such a way that they occur at the front, i.e., in the absorbed output from the source, and not behind, in the area to be illuminated.

It is also possible to construct the collector only from truncated cones, particularly if the collector includes multiple shells. This is advantageous from a manufacturing viewpoint.

If the shadows are ignored, it is then ensured that an equal radiant flux results both through the angular segments and/or ring aperture elements 20 to 24 and through the area segments and/or ring elements 30 to 34.

In principle, it is also possible to compensate for the reflection losses as a function of angle, and therefore as a function of the segment by suitable derivative action in the angle increments $\alpha_i$, whereby since one wishes to illuminate the area 7 largely homogeneously according to the present invention, the ring aperture segments, which are assigned to ring segments having identical increments, not being identically large. Alternatively, the height increments dr of the ring elements may also be selected to be of different size.

A nested collector 3 is shown in FIG. 4, made of ellipsoid segments which are positioned rotationally symmetrically around the z-axis, which ensures a largely equipartitioned illumination of the plane 7. Due to the rotational symmetry around the z-axis, only one half of the collector 3 is shown in section. The collector shown in FIG. 4 includes four shells 40, 42, 44, and 46.

The shells 40, 42, 44, and 46 are positioned approximately equidistant from the z-axis, in regard to the maximum shell diameter, which is approximately proportional to the shell number i, i.e., the spacing of two adjacent shells is approximately equal.

Each mirror shell 40, 42, 44, 46 is assigned an inner edge beam 41.1, 43.1, 45.1, 47.1, which is given by the end point of the optical surface of the mirror shell, and an outer edge beam 41.2, 43.2, 45.2, 47.2, which is determined by the starting point of the optical surface of the mirror shell. As may be clearly seen in FIG. 4, the inner and outer edge beams of each mirror shell define a beam bundle 49.1, 49.2, 49.3, 49.4 assigned to this mirror shell, which is reflected on the optical surfaces of the mirror shells 40, 42, 44, 46 in the direction of the image source. Optical surface(s) of a mirror shell is/are understood in the present application as the area(s) of the mirror shell which receive(s) the beam bundle incident from the light source 1 and reflect(s) it in the direction of the image 5 of the light source. The incident beam bundle and the beam bundle reflected on the optical surfaces of the mirror shells define a region used by the light between two neighboring or adjacent mirror shells. It may also be clearly seen that an unused region 51.1, 51.2, 51.3, 51.4 is provided on the side of the adjacent mirror shell facing away from the optical surfaces, in which components without optical effect, such as cooling devices, may be positioned, for example. The advantage of positioning cooling devices, for example, in these unused regions is that they allow cooling without additional loss of light.

Furthermore, the light source 1, the plane 7 to be illuminated, and the source image 5 are shown in FIG. 4.

The reference numbers of the other elements correspond to those in the preceding figures.

Alternatively, an arrangement is possible in which the length of the shells is reduced, as shown in FIG. 5. For example, the innermost angular segment and/or ring aperture element 20 may be divided into two angular segments and/or ring aperture elements 20.1 and 20.2. Correspondingly, the assigned innermost ring element 30 in the area 7 is also divided into two ring elements 30.1, 30.2. Two shells 40.1, 40.2 then result for the two inner segments, which are shorter than one shell 40, as may be clearly seen from FIG. 5. Identical components as in the preceding figures are provided with the same reference numbers.

A similar arrangement may also be possible for refractive systems. For refractive systems, the nested mirror shells 40, 42, 44, 46 are replaced by annular off-axis segments of lenses 50, 52, 54, 56, as shown in FIG. 6.

Figure 6:
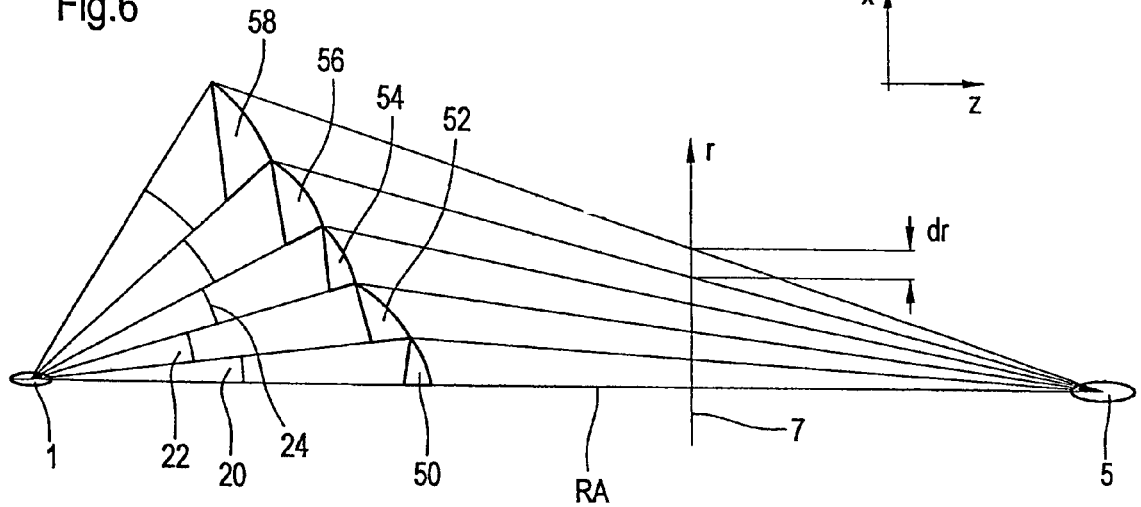
FIG. 6 shows a refractive nested collector

FIG. 6 schematically shows an arrangement of annular off-axis segments of lenses, which results in equipartitioned illumination of the plane 7 for a specific emission characteristic of the source. Only half of the system, which is rotationally symmetric around the z-axis, is schematically shown in section. Angular elements of different sizes are reflected on height segments of equal sizes and homogeneous illumination is therefore achieved even in the event of anisotropic source emission.

Nested, reflective collectors necessarily have a central shadowing, i.e., below a specific aperture angle $NA_{min}$, the emission of the source may not be absorbed. This radiation must therefore be blocked by a diaphragm, so that light may not reach the illumination system. The diaphragm may, for example, be attached in the collector.

In the following, the present invention is to be described in greater detail on the basis of an exemplary embodiment.

Point-to-point imaging having a real source image for an isotropic source with a family of ellipses corresponding to the present invention is assumed, the intervals of adjacent mirror shells being selected to be approximately equal.

An ellipse is defined according to the equation $$\frac{z^2}{a^2} + \frac{x^2}{b^2} = 1 \tag{3.1}$$

with $$c = \sqrt{a^2 - b^2}. \tag{3.2}$$

Figure 7:
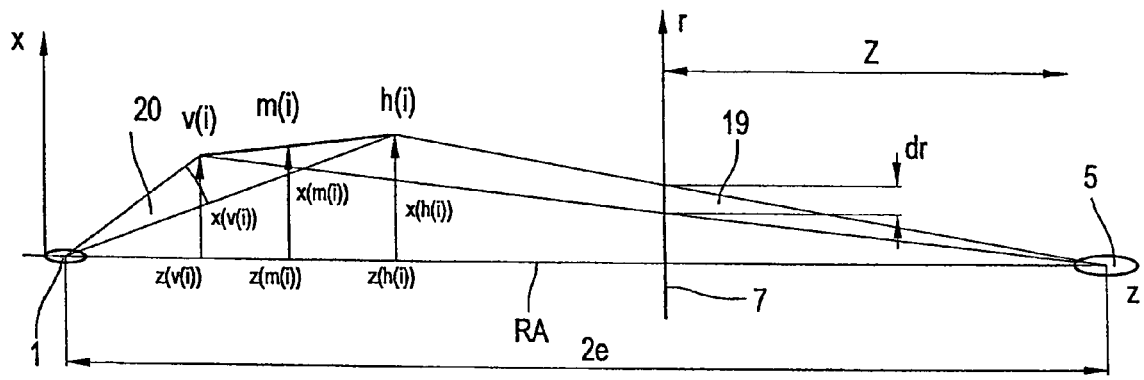
FIG. 7 shows the ith elliptical segment of a nested collector

The ith ellipse segment is shown in FIG. 7 for exemplary purposes. Since this is rotationally symmetric around the z-axis, only one half is shown in section.

Figure 8:
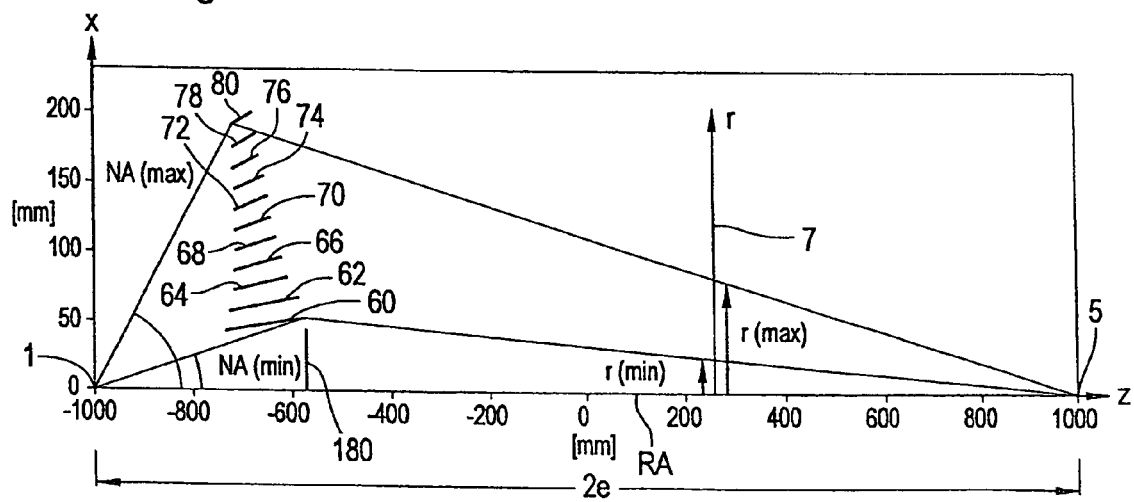
FIG. 8 shows the family of ellipses of a nested collector according to the exemplary embodiment in Table 1

The dimensions used for the calculation according to Table 1 are shown for a mirror shell in FIG. 7. The same reference numbers as in the preceding figures are used for identical components.

v(i) indicates the ith starting point of the ith mirror shell
x(v(i)) indicates the x coordinate of the ith starting point
z(v(i)) indicates the z coordinate of the ith starting point, i.e., the starting point in relation to the axis of rotation RA
h(i) indicates the ith end point of the ith mirror shell
x(h(i)) indicates the x coordinate of the ith end point
z(h(i)) indicates the z coordinate of the ith end point, i.e., the end point in relation to the axis of rotation RA
m(i) indicates the average value of the starting and end points of the ith shell
x(m(i)) indicates the x coordinate of the average value
z(m(i)) indicates the z coordinate of the average value, i.e., the average value of the starting and end points of the ith shell in relation to the axis of rotation RA
a, b indicates parameters of the ellipse
r(i) indicates the distance of the ith ring element of the ith shell in the plane to be illuminated from the axis of rotation RA
NA(i) indicates the sine of the aperture angle of the inner edge beams of the ith ring aperture element of the ith shell FIG. 8 shows the family of ellipses of the shells 60, 62, 64, 66, 68, 70, 72, 74, 76, 80 resulting for the exemplary embodiment calculated using the parameters defined above. In the present exemplary embodiment, both equally large angular increments $d\alpha$ and equally large height increments dr were selected. This is possible with isotropic sources and small apertures, particularly if the irradiance is to be only approximately equal. The data is indicated in Table 2. All lengths in Table 2 are indicated in mm. All angles of incidence relative to the surface tangents are below 19°. The angle of incidence relative to the surface tangent of the maximum beam in the exemplary embodiment according to FIG. 8 is 18.54°.

The following values were selected as starting values:
Distance between plane 7 and source image 5:
z=900 mm
Half focal point distance:
e=1000 mm
Height increment on surface 7:
dr=7.5 mm
Central shadowing in surface 7:
$r_{min}$~22.5 mm ($NA'_{min}$~0.025)
Minimum aperture $NA_{min}$ for source 1:
$NA_{min}$=0.12
Maximum aperture $NA_{max}$ for light received by the collector
$NA_{max}$<0.55, corresponding to 33°
Angular increments at source 1:
$d\alpha_i$=2.4°=const.

TABLE 2

Parameters of the family of ellipses

| I | Ref. no. | r(i) | NA(i) | a | b | x(h(i)) | z(h(i)) | x(v(i)) | z(v(i)) |
|---|---|---|---|---|---|---|---|---|---|
| 1 | 60 | 22.507 | 0.120 | 1002.009 | 63.422 | 52.266 | −567.601 | 43.117 | −734.837 |
| 2 | 62 | 30.007 | 0.161 | 1003.391 | 82.423 | 66.429 | −593.993 | 57.195 | −722.489 |
| 3 | 64 | 37.507 | 0.203 | 1005.130 | 101.423 | 80.551 | −610.765 | 71.258 | −715.251 |
| 4 | 66 | 45.007 | 0.243 | 1007.231 | 120.475 | 94.679 | −622.848 | 85.334 | −710.997 |
| 5 | 68 | 52.507 | 0.284 | 1009.699 | 139.612 | 108.836 | −632.382 | 99.443 | −708.705 |
| 6 | 70 | 60.007 | 0.324 | 1012.540 | 158.863 | 123.046 | −640.449 | 113.597 | −707.824 |
| 7 | 72 | 67.507 | 0.363 | 1015.762 | 178.250 | 137.317 | −647.655 | 127.810 | −708.034 |
| 8 | 74 | 75.007 | 0.402 | 1019.374 | 197.798 | 151.664 | −654.371 | 142.092 | −709.139 |
| 9 | 76 | 82.507 | 0.440 | 1023.386 | 217.529 | 165.097 | −660.836 | 156.455 | −711.012 |
| 10 | 78 | 90.007 | 0.477 | 1027.808 | 237.466 | 180.628 | −667.215 | 170.909 | −713.571 |
| 11 | 80 | 97.507 | 0.513 | 1032.654 | 257.632 | 195.269 | −673.626 | 185.464 | −716.763 |

In FIG. 9, the imaging scale β of the exemplary embodiment shown in FIG. 8 and Table 2 is shown as the measure of the homogeneity of the illumination as a function of the image aperture angle. The imaging scale β does not have to be constant over the angle, but a specific imaging scale must result over the maximum radius $r_{max}$ in plane 7.

In FIG. 10, the ideal imaging scale β-ideal and the real imaging scale β are shown as a function of the radius r in the plane 7 by discreted solution of the collimation problem. The deviation from the ideal imaging scale may be reduced by increasing the number of shells, by splitting the inner shells into two shells each, for example, as shown in FIG. 5. In this way, even better homogenization of the illumination may be achieved in area 7.

A schematic view of a projection exposure apperatus, for the production of microelectronic components, for example, in which the present invention may be used, is shown in FIG. 11. The projection exposure apparatus includes a light source or an intermediate image of a light source 1. The light emitted by the light source 1, of which only four representative beams are shown, is collected by a nested collector 3 according to the present invention and deflected on a mirror 102 having multiple first raster elements, or field honeycombs. In the present case, the first raster elements are planar. The mirror 102 is also referred to as a field honeycomb mirror. The illumination in the plane 103, in which the field honeycomb mirror is positioned, is largely homogeneous in a predetermined annular region, as shown in FIG. 12. The plane 103 is not exactly perpendicular to the optical axis of the collector and therefore does not exactly correspond to the homogeneous plane 7 to be illuminated from FIG. 1. However, a slight angle of inclination does not change the derivation and only leads to slight distortions of the illumination and therefore to a deviation from homogeneity, as would exist in a plane perpendicular to the optical axis of the collector, which may be ignored. The illumination system is a double-faceted illumination system as disclosed in U.S. Pat. No. 6,198,793 B1, whose content is included in its entirety in the present application. The system therefore includes a second optical elements having raster elements 104, which are referred to as pupil honeycombs. The optical elements 106, 108, and 110 are essentially used for the purpose of shaping the field in the object plane 114. The reticle in the object plane is a reflection mask. The reticle is movable in the EUV projection system, which is e.g. a scanning system, in the direction 116 shown. The exit pupil of the illumination system is illuminated largely homogeneously. The exit pupil is coincident with the entrance pupil of a projection objective which is situated in the light path from the light source to the object 124 to be illuminated after the illumination system; i.e. downstream of the illumination system. The entrance pupil of the projection objective is not shown. The entrance pupil is given by the point of intersection of the chief ray for e.g. the central field point of the field in the object plane of the illumination system with the optical axis of the projection objective.

A projection objective 126 having six mirrors 128.1, 128.2, 128.3, 128.4, 128.5, 128.6, for example, according to U.S. patent application Ser. No. 09/503,640, forms the reticle on the object 124 to be illuminated.

FIG. 12 shows the illumination distribution in the plane of the first optical element having first raster elements and the average value of the illumination. The irradiance E(r) is shown as a function of the radial distance r from the axis of rotation z of the nested collector. It may be seen clearly that the fulfillment of homogenized illumination is only discrete.

A schematic sketch of an EUV projection exposure apparatus is shown in FIG. 13, which differs from the apparatus shown in FIG. 11 only in that the light source 1 is imaged into an intermediate image Z. In addition, the first raster elements now have a collecting effect. The intermediate image Z of the light source 1 is implemented between collector 3 and the first faceted mirror 102. All of the other components are identical to the components shown in FIG. 11 and therefore have the same reference numbers.

Nested collectors according to the present invention, which are implemented as Wolter systems, are shown in the following FIGS. 14 to 21.

A Wolter system, preferably made of a combination of a hyperboloid and an ellipsoid for the real imaging of the light source 1 in an intermediate image Z of the source, but also a hyperboloid-paraboloid for imaging to infinity, is characterized by largely fulfilling the sine condition, i.e., the enlargement and/or the imaging scale of a combination of hyperboloid and ellipsoid is largely constant over a large aperture range. As shown in FIG. 9, the imaging scale β within the shell varies strong in a collector for homogenized illumination having only simple ellipsoid shells. In a Wolter system, in contrast, the imaging scale β inside the shell is largely constant. This is shown in FIG. 14 for an 8-shell nested system as shown in FIG. 17, in which each individual one of the nested mirror shells is a Wolter system, having a first annular segment having a first optical surface, which is a section of a hyperboloid, and a second annular segment having a second optical surface, which is a section of an ellipsoid. Wolter systems therefore have two optical surfaces per shell, a first and a second optical surface, in contrast to the systems having simple ellipsoid shells. These surfaces may also be mechanically separated from one another.

Since, as shown in FIG. 14, a shell of a Wolter system has a nearly constant imaging scale β, it is necessary, to achieve ideal homogenized illumination of a plane, that gaps arise in the object-side aperture. This is particularly true because in the event of grazing incidence, the reflectivity on the shells which have the greatest distance to the axis of rotation is lower than for shells which have the smallest distance to the axis of rotation. Molybdenum, niobium, ruthenium, rhodium, palladium, or gold are preferably considered as mirror materials. This must be compensated for through increasing imaging scale. The imaging scale must then be changed from shell to shell for homogeneous illumination. If, at the same time, one wishes to achieve continuous filling of the aperture after the collector and/or continuous illumination of the area 7 behind the nested collector, gaps arise in the object-side aperture. This is not the case in a collector having ellipsoidal shells, for example, as described in FIGS. 1 to 13, since then the imaging scale varies over the shells and thus, in addition to the homogenized, continuous illumination of a plane 7, a continuous object-side aperture may also be achieved.

In FIG. 15, three shells of a nested collector according to the present invention are shown as examples, each mirror shell 200, 202, and 204 having a Wolter system having a first annular segment 200.1, 202.1, 204.1, which has a first optical surface 200.2, 202.2, 204.2, and a second annular segment 200.3, 202.3, 204.3, which has a second optical surface 200.4, 202.4, 204.4. The individual shells 200, 202, 204 are positioned rotationally symmetrically around the z-axis. The imaging scale β of the innermost shell 204 is 6.7, that of the second shell 202 is 7.0, and that of the outermost shell 200 is 7.5. As may be seen from FIG. 15, the ring aperture elements 210, 212, 214, which are assigned to the particular mirror shells 200, 202, and 204, do not adjoin one another, i.e., the object-side aperture of the collector shown in FIG. 15 has gaps 220, 222, 224 between the individual ring aperture elements 210, 212, 214. The ring elements 230, 232, 234 in the plane 7 assigned to the particular mirror shells 200, 202, 204 adjoin one another largely continuously to achieve homogeneous illumination of a region of the plane 7.

Cooling devices 203.1, 203.2, 203.3 are preferably positioned in the region of the gaps 220, 222 of the ring aperture elements on the back of the mirror shells 200, 202, 204. The cooling devices are preferably cooling channels which may have a coolant flushed through them. The cooling devices 203.1, 203.2, 203.3 extend on the back of the particular shells largely over their entire length in the direction of the axis of rotation. An embodiment having additional components which are positioned in an unused region of the collector between two mirror shells is shown in greater detail and described in FIG. 25.

Each shell 200, 202, 204 is assigned an inner edge beam 205.1, 207.1, 209.1, which is defined by the end point in the meridional plane of the first optical surface of the first segment of the mirror shell, and an outer edge beam 205.2, 207.2, 209.2, which is defined by the starting point in the meridional plane of the first optical surface of the first segment of the mirror shell. The inner and the outer edge beam determine the beam bundle, which is received by the shell and guided to the source image within two adjacent shells. The region which a beam bundle 211.1, 211.2 does not pass through between two collector shells is, as already described for the single shell collector shown in FIG. 4, referred to as an unused region 213.1, 213.2. As may be clearly seen from FIG. 15, the cooling devices positioned in the region of the gaps of the ring aperture elements on the back of the mirror shells are positioned in the unused region between two mirror shells.

In the embodiment shown in FIG. 15, the first optical surface 200.2, 202.2, 204.2 and the second optical surface 200.4, 202.4, and 204.4 also adjoin one another directly without gaps.

A further exemplary embodiment of the present invention is shown in FIG. 16, only two mirror shells 200, 202, which are designed as a Wolter system, being illustrated for exemplary purposes. Identical components as in FIG. 15 are provided with the same reference numbers. In the embodiment in FIG. 16, the first optical surface 200.2, 202.2 and the second optical surface 200.4, 202.4 do not adjoin one another directly. There is a gap and/or an unused region 240, 242 between the optical surfaces. In the present exemplary embodiment, however, the mirror shells are continued in the unused region up to the intersection S1, S2 of the first and second segment 200.1, 202.1, 200.3, 202.3 of the particular mirror shell. Both first optical surfaces 200.2, 202.2 on the first mirror segments are delimited in the meridional plane by starting points 311.1, 312.1 and end points 311.2 and 312.2. The meridional plane is given in the present application by the plane which contains the optical axis or axis of rotation. Starting and end points 311.1, 312.1, 311.2, 312.2 of the optical surfaces define edge beams 205.1, 205.2, 207.1, and 207.2, which, when rotated around the axis of rotation, define a light bundle which is passed through the collector, i.e., runs through the collector from the object side to the image side. The light bundle passed through the collector in turn defines the used region of the collector.

As shown in FIG. 16, a cooling device, for example, a cooling shield running around the entire circumference of the mirror shell, may be positioned in the region of the gaps 240, 242. The cooling shields may be mechanically supported by ribs running in the direction of the axis of rotation, as shown in FIG. 26. For good thermal contact, the ribs are soldered to the peripheral cooling shields, for example. The support elements for the cooling shields, which run in the direction of the axis of rotation, may be attached to the support structures which support the mirror shells, spoked wheels, for example. The spoked wheels and support structures are not shown in the present FIG. 16.

A design having gaps and/or unused regions, as shown in FIG. 16, is advantageous for extended light sources.

Balancing between collection efficiency and homogeneity of the illumination is always to be performed in the design of the collector. If one wishes to achieve a homogeneity of only ±15% in the surface 7 to be illuminated, an 8-shell collector, as shown in FIG. 17, may be used for this purpose. In this case, 200, 202, 204, 205, 206, 207, 208, 209 indicate the particular mirror shells, each having two mirror segments and each shell representing a Wolter system.

The collector from FIG. 17 has a distance of 1500 mm between source 1 and intermediate image of the source Z, an object-side aperture of ~0.72 and an image-side aperture of ~0.115. All of the angles of incidence relative to the surface tangents are ≦130. The angle of incidence relative to the surface tangent of the maximum beam in the exemplary embodiment shown in FIG. 17 is 11.90.

Furthermore, a diaphragm 180 positioned in the inside of innermost mirror shell is shown in FIG. 17. Nested, reflective collectors necessarily have central shadowing due to the finite size of the mirror shells, i.e., below a minimum aperture angle $NA_{min}$ the radiation of the source may not be absorbed. The diaphragm 180 prevents light passing directly through the central shell from reaching the illumination system situated in the light paten behind the inventive collector as stray light.

The diaphragm 180 is, for example, positioned 78 mm behind the source and has a diameter of 30.3 mm, corresponding to an aperture obscuration of $NA_{obs}$~0.19. Correspondingly, the image-side aperture obscuration is $NA'_{obs}$~0.0277.

The characteristic coordinates of a Wolter system, including two segments, the first segment 200.1 and the second segment 200.3 of the first mirror shell 200, for example, are illustrated in FIG. 18 as an example for the mirror shells 200, 202, 204, 205, 206, 207, 208, 209 of the collector shown in FIG. 17. ZS indicates the z-position of the surface apex in relation to the position of the light source 1, ZV and ZH indicate the starting and end positions of the first segment 200.1, which is a hyperboloid, in relation to the position of the surface apex ZS. For the second segment 200.3 of the mirror shell, which is an ellipsoid, the reference letters ZS, ZH, and ZV are used in an analogous way.

Using the curvature radii R and the conical constants K of the particular mirror segment as well as the definitions specified, the design data of the collector shown in FIG. 17 from the following Table 3 result. Ruthenium was selected as the coating of the mirror shells.

TABLE 3

Design data of the collector shown in FIG. 17

| Shell | R[mm] | K | ZS[mm] | ZV[mm] | ZH[mm] |
|---|---|---|---|---|---|
| Hyperboloid | | | | | |
| 1 | 1.5866 | −1.0201 | −0.79 | 108.99 | 185.86 |
| 2 | 2.3481 | −1.0286 | −1.17 | 107.92 | 183.90 |
| 3 | 3.5076 | −1.0399 | −1.74 | 107.56 | 182.35 |
| 4 | 5.0414 | −1.0571 | −2.49 | 105.05 | 179.53 |
| 5 | 7.2534 | −1.0814 | −3.56 | 102.83 | 177.68 |
| 6 | 10.4354 | −1.1182 | −5.07 | 99.95 | 175.90 |
| 7 | 15.0523 | −1.1755 | −7.22 | 94.87 | 173.09 |
| 8 | 22.3247 | −1.2660 | −10.50 | 88.88 | 169.39 |
| Ellipsoid | | | | | |
| 1 | 2.3724 | −0.9971 | −160.94 | 349.66 | 433.46 |
| 2 | 3.3366 | −0.9960 | −168.17 | 353.68 | 440.17 |
| 3 | 4.6059 | −0.9945 | −181.56 | 363.50 | 454.10 |
| 4 | 6.4739 | −0.9923 | −184.74 | 364.03 | 457.33 |
| 5 | 9.0813 | −0.9893 | −189.80 | 366.19 | 463.15 |
| 6 | 12.8589 | −0.9849 | −193.20 | 365.14 | 466.03 |
| 7 | 18.4682 | −0.9783 | −195.28 | 362.33 | 470.02 |
| 8 | 26.8093 | −0.9688 | −202.36 | 362.94 | 480.72 |

The exemplary embodiment of the Wolter system shown in FIG. 17 having eight shells is selected in such a way that all shells end approximately in a plane 181. In this way, all shells may be mounted in a plane 181.

The spoked wheels shown in FIG. 27, which include a total of four support spokes in the embodiment shown in FIG. 27, may be used as the mounting of the shells and/or support of the shells. The support spokes provide stability to the nested collector having a plurality of mirror shells.

The diaphragm 180 is preferably positioned in or near this plane.

The illumination distribution defined in the plane 7 of the illumination system shown in FIG. 20 is shown in FIG. 19. The illumination system shown in FIG. 20 includes an 8-shell nested collector situated directly behind the light source, as shown in FIG. 17. The calculation of the irradiance as shown in FIG. 19 was based on a ruthenium coating of the mirror shells using their reflectivity, which is a function of the angle. The design of the collector may be adjusted appropriately for other coatings.

The central shadowing by the screen 180 may be seen clearly in FIG. 19. The central shadowing is indicated by the reference number 182. The shape of the intensity in plane 7 is indicated by 184. Two peaks of intensity 184.1, 184.2, which lead to an annular illumination in the plane 7 and which are symmetrical to the axis of rotation RA of the collector, may be seen clearly. The dashed curve 186 indicates the region in which first raster elements are positioned on the first optical element 102 of the illumination system shown in FIG. 20.

The optical components and the beam path of some light beams of a projection exposure apparatus having a nested collector as shown in FIG. 17 are shown in FIG. 20. Identical components as in the projection exposure apparatus shown in FIG. 11 are provided with the same reference numbers.

In contrast to the projection exposure apparatus shown in FIG. 11, the illumination system is not folded like an "X", but is optimized for compact installation space. To reduce the system length, the image-side aperture of the nested collector 3, which has a construction as in FIG. 17, is also increased to NA=0.115, for which the layout as a Wolter system is especially advantageous. The object-side aperture is NA~0.71. A planar mirror 300 for folding the system is also introduced following the collector 3, in order to provide installation space for mechanical and electronic components in the object plane, 114, in which the wafer stage is positioned. The overall optical system is less than 3 m long and less than 1.75 m tall.

In the present embodiment, the planar mirror 300 is designed as a diffractive spectral filter, i.e., realized by a grating. Together with the diaphragm 302 near the intermediate image Z of the source, undesired radiation having wavelengths significantly greater than the desired wavelength, for example, in the present case 13.5 nm, may thus be kept from entering the part of the illumination system behind the diaphragm 302.

The diaphragm 302 may also be used for the purpose of spatially separating the space 304 comprising light source 1 the nested collector 3, and the planar mirror 300, designed as a grating element from the following illumination system 306. If both spaces are separated by introducing a valve near the intermediate focus Z, separation in regard to pressure is also possible. Through spatial and/or pressure separation, contamination which arises from the light source may be prevented from reaching the illumination system behind the diaphragm 302.

The illumination system shown in FIG. 20 includes a nested collector 3 having 8 shells as shown in FIG. 17 and Table 3. The planar mirror 200 of the design shown in FIG. 20 is implemented as a spectral filter having a diffractive angle of 2° between 0 and the order of diffraction used. The first optical element 102 includes 122 first raster elements, each having dimensions of 54 mm×2.75 mm. The second optical element 104 has 122 second raster elements assigned to the first raster elements, each having a diameter of 10 mm. All indications of location of the optical components in Table 4 are in relation to the reference coordinate system in the object plane 114. The rotation around the angle α around the local x-axis of the local coordinate systems assigned to the particular optical components results after translational displacement of the reference coordinate system to the location of the local coordinate system. The parameters of the optical components of the illumination system shown in FIG. 20 are indicated in Table 4. In Table 4, the positions of the vertices of the individual optical elements in relation to the object plane 114 and the angle of rotation α of the coordinate systems around the x-axis are specified. Furthermore right-hand coordinate systems and clockwise rotation are used. Besides the local coordinate systems of the optical components, the local coordinate systems of the intermediate focus and the entrance pupil are indicated. The field-shaping mirror 110 includes an extra-axial segment of a rotational hyperboloid. The coordinate systems for all of the optical elements of the illumination system shown in FIG. 20 and described in Table 4, with the exception of the nested collector 3, are shown in FIG. 21. All of the optical elements are provided with the same reference numbers as in FIG. 20.

The system is calculated for a field radius of 130 mm with an illumination aperture of NA=0.03125 in object plane 114, i.e., on the reticle, corresponding to a filling ratio of σ=0.5 in the entrance pupil E of a downstream 4:1 projection objective having an aperture NA=0.25 in the plane 124 of the object to be illuminated.

object-side ring aperture elements 1002.1 and 1000.2 of the first mirror shell 1004.1 and the second mirror shell 1004.2. The image-side ring elements 1003.1, 1003.2 adjoin one another directly, so that there is no gap in the image space except for the necessary central shadowing 1005. In the collector shown, cooling devices 1006.1, 1006.2, 1006.3 are positioned in the unused region between the two mirror shells 1004.1, 1004.2 and inside and outside the collector. The mirror shells 1004.1, 1004.2 end approximately in one plane and may be mounted in this plane 1008 by a spoked wheel, for example, of which one spoke 1010 is shown. Each mirror shell 1004.1, 1004.2 of the embodiment shown includes two mirror segments, a first mirror segment 1007.1, 1007.2 having a first optical surface and a second mirror segment 1009.1, 1009.2 having a second optical surface, which are positioned one behind the other without gaps. The first mirror segments 1007.1, 1007.2 are segments of hyper-

TABLE 4

Design data of the system shown in FIG. 20

| Position | Y | Z | α | Apex curvature radius | Conical constants |
|---|---|---|---|---|---|
| Light source 1 | 2148.137 | −1562.205 | 70.862 | No mirror surface | |
| Planar mirror and/or spectral filter 200 | 1184.513 | −1227.797 | 147.434 | Planar | |
| Intermediate focus Z | 883.404 | −893.382 | 42.000 | No mirror surface | |
| First faceted optical element 102 | 302.599 | −248.333 | 36.000 | −898.54 | Spherical |
| Second faceted optical element 104 | 773.599 | −1064.129 | 214.250 | −1090.15 | Spherical |
| Mirror 106 | 126.184 | −250.216 | 31.500 | 288.1 | Spherical |
| Mirror 108 | 372.926 | −791.643 | 209.600 | −855.8 | Spherical |
| Mirror apex of mirror 110 | −227.147 | 118.541 | −4.965 | −80.5 | |
| Object plane 114 | 0.000 | 0.000 | 0.000 | Planar | |
| Entrance pupil E | −130.000 | −1236.867 | 0.000 | No mirror surface | |

As in the nested collector shown in FIGS. 1 to 13, the shells of the Wolter system may also be produced easily by molding technologies.

The first optical element 102 in the plane 103 of the illumination system shown in FIG. 20 having a local x-y coordinate systems is shown in FIG. 22. The arrangement of the 122 first raster elements 150 is clearly shown.

The first raster elements 150 are positioned in ten blocks 152.1, 152.2, 152.3, 152.4, 152.5, 152.6, 152.7, 152.8, 152.9, 152.10 at intervals from one another.

No first raster elements 150 are positioned in the region in the plane 103 not illuminated due to the central shadowing 154 of the collector 3. The maximum deviation of the irradiance between individual first raster elements 150 is less than ±15% if a nested collector as shown in FIG. 17 is used.

FIG. 23 shows the arrangement of the second raster elements 156 on the second optical element 104. The images of the second raster elements 158 fill the exit pupil of the illumination system continuously up to a given filling ratio of σ=0.5. Reference is made to WO 01/09684, the content of whose disclosure is included in its entirety in the present application, in regard to the definition of the filling ratio in the exit pupil.

A first embodiment of a nested collector according to the present invention having, for example, two mirror shells 1004.1, 1004.2 positioned one inside the other is shown in FIG. 24, in which the ring aperture elements, as in the nested collector shown in FIG. 15, have a gap 1000 between the boloids in the present exemplary embodiment and the second mirror segments 1009.1, 1009.2 are segments of ellipsoids.

As may be clearly seen in the meridian section shown in FIG. 24, the inner and outer edge beams 1016.1, 1016.2, 1018.1, 1018.2 of the particular mirror shell and/or the connection lines assigned to them between the source 1, the image of the source 5, the shell ends 1024.1, 1024.2 and, in systems having two mirror segments, also the transition region between the first mirror segment 1007.1, 1007.2 and the second mirror segment 1009.1, 1009.2, define an optically used region or a beam pipe through which the radiant flux flows from the object and/or from the light source 1 to the image 5 of the light source. A meridian section or a meridional plane is the plane which includes the axis of rotation RA. An unused region 1032 now lies between the used regions 1030.1, 1030.2 of at least two mirror shells 1004.1, 1004.2 positioned one inside the other. This region is completely in the shadow region of the inner collector shell 1004.1. In addition, the unused region, as in the present exemplary embodiment and in the exemplary embodiment shown in FIGS. 15 and 16, may be in a forward aperture gap 1000, i.e., a gap between the ring aperture elements 1002.1, 1002.2. This object-side aperture gap 1000 is not transferred into the image 5 of the light source and therefore remains unused.

Further components of the nested collector may be positioned in the unused region 1032 between two mirror shells

1004.1, 1004.2 without influencing the radiant flux from the light source 1 to the image 5 of the light source. Examples of components of this type would be detectors or decoupling mirrors which deflect light onto detectors or non-optical components such as heat shields or cold traps. The cooling devices 1006.1, 1006.2, 1006.3 may be in direct contact with the backs of the collector shells. The arrangement of electrodes or magnets to deflect charged or magnetic particles is also possible. Electrical lines or lines to supply and remove coolant may be guided with only slight shadowing of the image-side collector aperture, i.e., the illuminated region in the image-side plane still outside the collector. These lines 1044 are preferably guided in the region of the shadows of the necessary support devices of the mirror shells, for example, the spoked wheel having spokes 1010. Naturally, further cooling elements or detectors may also be positioned in regions outside the outermost shell 1004.2 or the central shadowing 1052. A diaphragm may also preferably be positioned in the region of the central shadowing, as is shown in FIG. 8, for example.

A further exemplary embodiment of the present invention is shown in FIG. 25. The exemplary embodiment shown in FIG. 25 again shows a system having two mirror shells 1104.1, 1104.2. Identical components as in FIG. 24 have a reference number increased by 100. In contrast to the embodiment in FIG. 24, the collector shown in FIG. 25 is a system in which each mirror shell includes only one single segment 1107.1, 1109.1, specifically the segment of an ellipsoid. Furthermore, the ring aperture element has no gaps. In the present case, an annular cooling device 1106.1, 1106.2, in the form of annular plates, for example, is positioned in the unused region 1132 between the two mirror shells 1104.1, 1104.2. The annular plates again preferably have a coolant flowing through them. The coolant is supplied and removed via coolant lines 1144, which lead from the cooling plate 1106.1, 1106.2 to a spoke 1110, which mounts the individual mirror shells as described above. The implementation of the cooling device as an annular plate allows a homogeneous and rotationally symmetric cooling to be achieved over a large area. The plates may be connected permanently to the mirror shell, through galvanic deposition, for example. The heat is then removed through thermal conduction. Alternatively, the shells may also be merely laid in place. In this way, mutual influence due to thermal expansion of the mirror shell and/or the cooling plate is avoided. The heat is then removed exclusively through radiation.

The cooling devices may also be implemented as cooling rings which extend around the entire circumference of the collector. Cooling rings and particularly their support are shown in FIG. 26. The cooling rings 1200.1 and 1200.2 are positioned in the unused space between two mirror shells of a collector having, for example, two segments per mirror shell. A two-shell Wolter collector of this type is illustrated in meridional section in FIG. 24, for example. The cooling rings 1200.1, 1200.2 are supported on holding structures and/or ribs 1202.1, 1202.2, 1202.3, 1202.4, which run in the shadows of the spokes of the spoked wheel and extend in the direction of the axis of rotation. The cooling rings 1200.1 and 1200.2 may be connected to the support ribs 1202.1, 1202.2, 1202.3, 1202.4 via soldering, for example. This guarantees good mechanical and thermal contact. The ribs are preferably manufactured from a material having good thermal conductivity, copper, for example, and are easily solderable. The cooling rings 1202.1, 1202.2 are preferably also made of a material having good thermal conductivity such as copper or steel.

The ribs 1202.1, 1202.2, 1202.3, 1202.4 are attached, using screws, for example, to the four spokes 1204.1, 1204.2, 1204.3, 1204.4 of a spoked wheel, which mounts the individual mirror shells. The spokes run in the radial direction, i.e., in a direction perpendicular to the axis of rotation.

Using the present invention, a collector is specified for the first time which images any arbitrary light source in an image of the source. The source image may be real, virtual, or lie in the infinite. The emission characteristic of the arbitrary light source is transformed in such a way that a largely homogeneous illumination results in a plane in front of or behind the intermediate image.

It should be understood by a person skilled in the art, that the disclosure content of this application comprises all possible combinations of any element(s) of any claims with any element(s) of any other claim, as well as combinations of all claims amongst each other.

What is claimed is:

1. A collector for illumination systems for light having a wavelength $\leq 193$ nm comprising:
    a first mirror shell adjacent to, and positioned inside of, a second mirror shell around a common axis of rotation, wherein said first and second mirror shells are rotationally symmetric, and wherein at least one of said first and second mirror shells includes a first segment having a first optical surface and a second segment having a second optical surface; and
    a component in a region between said first and second mirror shells,
    wherein said collector is for receiving said light from a light source via an object-side aperture and for illuminating an area in an image-side plane, and
    wherein said region is not used by said light.

2. The collector of claim 1,
    wherein said first optical surface and said second optical surface do not adjoin one another continuously, and
    wherein said collector further comprises a gap between said first optical surface and said second optical surface.

3. The collector of claim 2, wherein said component is positioned in said gap.

4. The collector of claim 1,
    wherein said first segment is annular and a section of a hyperboloid, and
    wherein said second segment is annular and a section of an ellipsoid.

5. The collector of claim 1,
    wherein said first segment is annular and a section of a hyperboloid, and
    wherein said second segment is annular and a section of a paraboloid.

6. The collector of claim 1, wherein said component comprises a cooling device having a channel through which a coolant flows.

7. The collector of claim 1, further comprising a support device for supporting at least one of said first mirror shell or said second mirror shell.

8. The collector of claim 7, wherein said support device has a support spoke that extends in a radial direction of said first and second mirror shells.

9. The collector of claim 7,
    wherein said component comprises a coolant supply device and a coolant removal device, and
    wherein said coolant supply device and said coolant removal device are positioned in a region of said support device.

10. The collector of claim 1, wherein said light is incident on said first and second mirror shells at angles of incidence <20° to surface tangents of said first and second mirror shells.

11. An illumination system for wavelengths ≦193 nm, comprising:
   a light source;
   a plane to be illuminated; and
   a collector having:
      a first mirror shell adjacent to, and positioned inside of, a second mirror shell around a common axis of rotation, wherein said first and second mirror shells are rotationally symmetric, and wherein at least one of said first and second mirror shells includes a first segment having a first optical surface and a second segment having a second optical surface; and
      a component in a region between said first and second mirror shells,
   wherein said collector is for receiving said light from said light source via an object-side aperture and for illuminating an area in said plane, and
   wherein said region is not used by said light.

12. The illumination system of claim 11, further comprising an optical element having a plurality of raster elements in a light path from said light source to said plane.

13. The illumination system of claim 12,
   wherein said collector illuminates an annular region in said plane, and
   wherein said plurality of raster elements are positioned in said plane substantially inside said annular region.

14. The illumination system of claim 12, further comprising an optical element having a function selected from the group consisting of imaging and field shaping.

15. The illumination system of claim 12, further comprising a plane conjugated to said light source, between said collector and said plane to be illuminated, in which an intermediate image of said light source is formed.

16. The illumination system of claim 15, further comprising a diaphragm positioned in or near said intermediate image, that separates said illumination system into a first space and a second space, wherein said first space includes said light source and said collector.

17. The illumination system of claim 16,
   wherein said first space has a first internal pressure and said second space has a second internal pressure, and
   wherein said first internal pressure and said second internal pressure are different from one another.

18. An EUV projection exposure facility comprising:
   (a) an illumination system for wavelengths ≦193 nm for illuminating a mask, said illumination system including:
      a light source;
      a plane to be illuminated; and
      a collector having:
         a first mirror shell adjacent to, and positioned inside of, a second mirror shell around a common axis of rotation, wherein said first and second mirror shells are rotationally symmetric, and wherein at least one of said first and second mirror shells includes a first segment having a first optical surface and a second segment having a second optical surface; and
         a component in a region between said first and second mirror shells,
      wherein said collector is for receiving said light from said light source via an object-side aperture and for illuminating an area in said plane, and
      wherein said region is not used by said light; and
   (b) a projection objective for imaging said mask on a light-sensitive object.

19. A method of manufacturing a microelectronic component, comprising using an EUV projection exposure facility having:
   (a) an illumination system for wavelengths ≦193 nm for illuminating a mask, said illumination system including:
      a light source;
      a plane to be illuminated; and
      a collector having:
         a first mirror shell adjacent to, and positioned inside of, a second mirror shell around a common axis of rotation, wherein said first and second mirror shells are rotationally symmetric, and wherein at least one of said first and second mirror shells includes a first segment having a first optical surface and a second segment having a second optical surface; and
         a component in a region between said first and second mirror shells,
      wherein said collector is for receiving said light from said light source via an object-side aperture and for illuminating an area in said plane, and
      wherein said region is not used by said light; and
   (b) a projection objective for imaging said mask on a light-sensitive object.

20. An illumination system for wavelengths ≦193 nm, comprising:
   a light source;
   a plane to be illuminated;
   a collector having:
      a first mirror shell adjacent to, and positioned inside of, a second mirror shell around a common axis of rotation, wherein said first and second mirror shells are rotationally symmetric; and
      a component in a region between said first and second mirror shells,
   wherein said collector is for receiving said light from said light source via an object-side aperture and for illuminating an area in said plane, and
   wherein said region is not used by said light;
   an optical element having a plurality of raster elements in a light path from said light source to said plane;
   a plane conjugated to said light source, between said collector and said plane to be illuminated, in which an intermediate image of said light source is formed; and
   a diaphragm positioned in or near said intermediate image, that separates said illumination system into a first space and a second space, wherein said first space includes said light source and said collector.

21. The illumination system of claim 20,
   wherein said first space has a first internal pressure and said second space has a second internal pressure, and
   wherein said first internal pressure and said second internal pressure are different from one another.

* * * * *